(12) United States Patent
Hamashima

(10) Patent No.: US 8,112,875 B2
(45) Date of Patent: Feb. 14, 2012

(54) VACUUM SUCTION NOZZLE FOR COMPONENT MOUNTING APPARATUS

(75) Inventor: Hiroshi Hamashima, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 58 days.

(21) Appl. No.: 12/603,884

(22) Filed: Oct. 22, 2009

(65) Prior Publication Data

US 2010/0037456 A1 Feb. 18, 2010

Related U.S. Application Data

(63) Continuation-in-part of application No. PCT/JP2008/058042, filed on Apr. 25, 2008.

(30) Foreign Application Priority Data

Apr. 25, 2007 (JP) .................................. 2007-115441

(51) Int. Cl.
*H05K 13/04* (2006.01)
(52) U.S. Cl. ............................... 29/743; 294/188; 294/2
(58) Field of Classification Search .................... 29/743, 29/740, 739; 294/64.1, 188, 2
See application file for complete search history.

(56) References Cited

U.S. PATENT DOCUMENTS

| 5,033,185 | A * | 7/1991 | Hidese | 29/740 |
| 7,886,427 | B2 * | 2/2011 | Uchida et al. | 29/743 |
| 2007/0289125 | A1 | 12/2007 | Uchida et al. | |
| 2010/0037456 | A1 * | 2/2010 | Hamashima | 29/739 |

FOREIGN PATENT DOCUMENTS

| JP | 2090700 | 3/1990 |
| JP | 5275513 | 10/1993 |
| JP | H05-275513 A | 10/1993 |
| JP | 10117099 | 5/1998 |
| JP | 2000-151200 A | 5/2000 |
| JP | 2000151200 | 5/2000 |
| JP | 2003-012368 A | 1/2003 |
| JP | 2003012368 | 1/2003 |
| JP | 2003-045139 A | 2/2003 |
| JP | 2003045139 | 2/2003 |
| JP | 2003-243718 A | 8/2003 |
| JP | 2004196589 | 7/2004 |
| JP | 2006-108138 A | 4/2006 |
| JP | 2006108138 | 4/2006 |
| WO | 2005/061188 A1 | 7/2005 |

OTHER PUBLICATIONS

PCT/JP2008/058042, ISA/JP, International Search Report, May 27, 2008.
Notification of Reasons for Refusal dated Jul. 12, 2011 for counterpart Japanese Application No. 2009-511915.

\* cited by examiner

*Primary Examiner* — Minh Trinh
(74) *Attorney, Agent, or Firm* — Procopio, Cory, Hargreaves & Savitch LLP

(57) ABSTRACT

A vacuum suction nozzle operable to reduce or eliminate electronic component blow off and electrostatic damage is disclosed. The vacuum suction nozzle comprises a ceramic body with a first surface at a side opposite to a second surface of the ceramic body. The ceramic body causes static electricity generated on the vacuum suction nozzle to be dissipated to an electronic component mounting device. Dissipation of the static electricity reduces or eliminates electrostatic damage to the electronic component and electrostatic repulsion induced blow off during suction by the vacuum suction nozzle.

18 Claims, 7 Drawing Sheets

VACUUM SUCTION NOZZLE FOR COMPONENT MOUNTING APPARATUS

CROSS-REFERENCE TO RELATED APPLICATION

This application is a continuation in part based on PCT Application No. JP2008/058042, filed Apr. 25, 2008, which claims the benefit of Japanese Patent Application No. 2007-115441, filed on Apr. 25, 2007, entitled "VACUUM SUCTION NOZZLE," the content of which is incorporated by reference herein in its entirety.

FIELD

The present invention relates generally to vacuum suction nozzles, more particularly to a vacuum suction nozzle for picking, transport, and placement of electronic components.

BACKGROUND

An electronic component mounting apparatus including an electronic component mounting device has been used to mount chip-like electronic components such as chip capacitors and chip resistors on a circuit board. The electronic component mounting device vacuum-sucks an electronic component with a vacuum suction nozzle, transports it to the circuit board, and mounts it at a predetermined position on the circuit board.

Such electronic component mounting apparatuses often include a measurement optical system for checking the position of the electronic component in order to accurately mount the electronic component at a predetermined position. The measurement optical system can include a lighting device, a CCD camera, and an imaging device connected to the CCD camera. The electronic component is irradiated with light from the lighting device, and the CCD camera receives reflected light from the electronic component. The resulting image captured by the CCD camera is analyzed by an image analysis device to measure the shape of the electronic component and positions of electrodes of the electronic component.

Currently, a vacuum suction nozzle moves at a high speed between a tray and a circuit board so that a high speed moving nozzle may hit an electric component. When electronic components are small and lightweight, the electronic components are sometimes blown off a predetermined position of a tray. In addition, a vacuum suction nozzle may build up static electricity when moving at high speed by friction with air or dust in the air. This static electricity may cause the vacuum suction nozzle to lose its hold on an electronic component due to electrostatic repulsion and fail to transport the electronic component to a predetermined location. The electrostatic discharge of the static electricity can also cause damage to the electronic component.

Accordingly, there is a need for a vacuum suction nozzle that retains a hold on an object during high speed motion, and protects against damage caused by static electricity.

SUMMARY

A vacuum suction nozzle operable to reduce or eliminate electronic component blow off and electrostatic damage is disclosed. The vacuum suction nozzle comprises a ceramic body with a first surface at a side opposite to a second surface of the ceramic body. The ceramic body causes static electricity generated on the vacuum suction nozzle to be dissipated to an electronic component mounting device. Dissipation of the static electricity reduces or eliminates electrostatic damage to the electronic component and electrostatic repulsion induced blow off during suction by the vacuum suction nozzle.

A first embodiment comprises a vacuum suction nozzle. The vacuum suction nozzle comprises a ceramic body, a first surface of the ceramic body, and a second surface of the ceramic body at a side opposite to the first surface. The ceramic body has an electric resistance of $10^3 \Omega$ to $10^{11} \Omega$ between the first surface and the second surface. The vacuum suction nozzle also comprises a through hole extending from the first surface to a rear surface; and an opening of the through hole on the first surface.

A second embodiment comprises an electronic component mounting apparatus. The electronic component mounting apparatus comprises an electronic component mounting device, and a vacuum suction nozzle coupled to the electronic component mounting device and operable to suck electronic components. The vacuum suction nozzle comprises a ceramic body, a first surface of the ceramic body, and a second surface of the ceramic body at a side opposite to the first surface. The ceramic body has an electric resistance of $10^3 \Omega$ to $10^{11} \Omega$ between the first surface and the second surface. The vacuum suction nozzle also comprises a through hole extending from the first surface to a rear surface; and an opening of the through hole on the first surface. The electronic component mounting apparatus also comprises a measurement optical system operable to determine a position of the electronic component.

BRIEF DESCRIPTION OF THE DRAWINGS

Embodiments of the present invention are hereinafter described in conjunction with the following figures, wherein like numerals denote like elements. The figures are provided for illustration and depict exemplary embodiments of the invention. The figures are provided to facilitate understanding of the invention without limiting the breadth, scope, scale, or applicability of the invention. The drawings are not necessarily made to scale.

DETAILED DESCRIPTION OF EXEMPLARY EMBODIMENTS

The following description is presented to enable a person of ordinary skill in the art to make and use the embodiments of the invention. The following detailed description is exemplary in nature and is not intended to limit the invention or the application and uses of the embodiments of the invention. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the invention. Furthermore, there is no intention to be bound by any expressed or implied theory presented in the preceding technical field, background, brief summary or the following detailed description. The present invention should be accorded scope consistent with the claims, and not limited to the examples described and shown herein.

Embodiments of the invention are described herein in the context of practical non-limiting applications, namely, vacuum suction nozzles. Embodiments of the invention, however, are not limited to such applications, and the techniques described herein may also be utilized in other nozzle applications. For example, embodiments may be applicable to an electronic component mounting apparatus and the like.

In this document, a term "vacuum" means a reduced pressure less than 1 atmosphere.

Figure 1A:
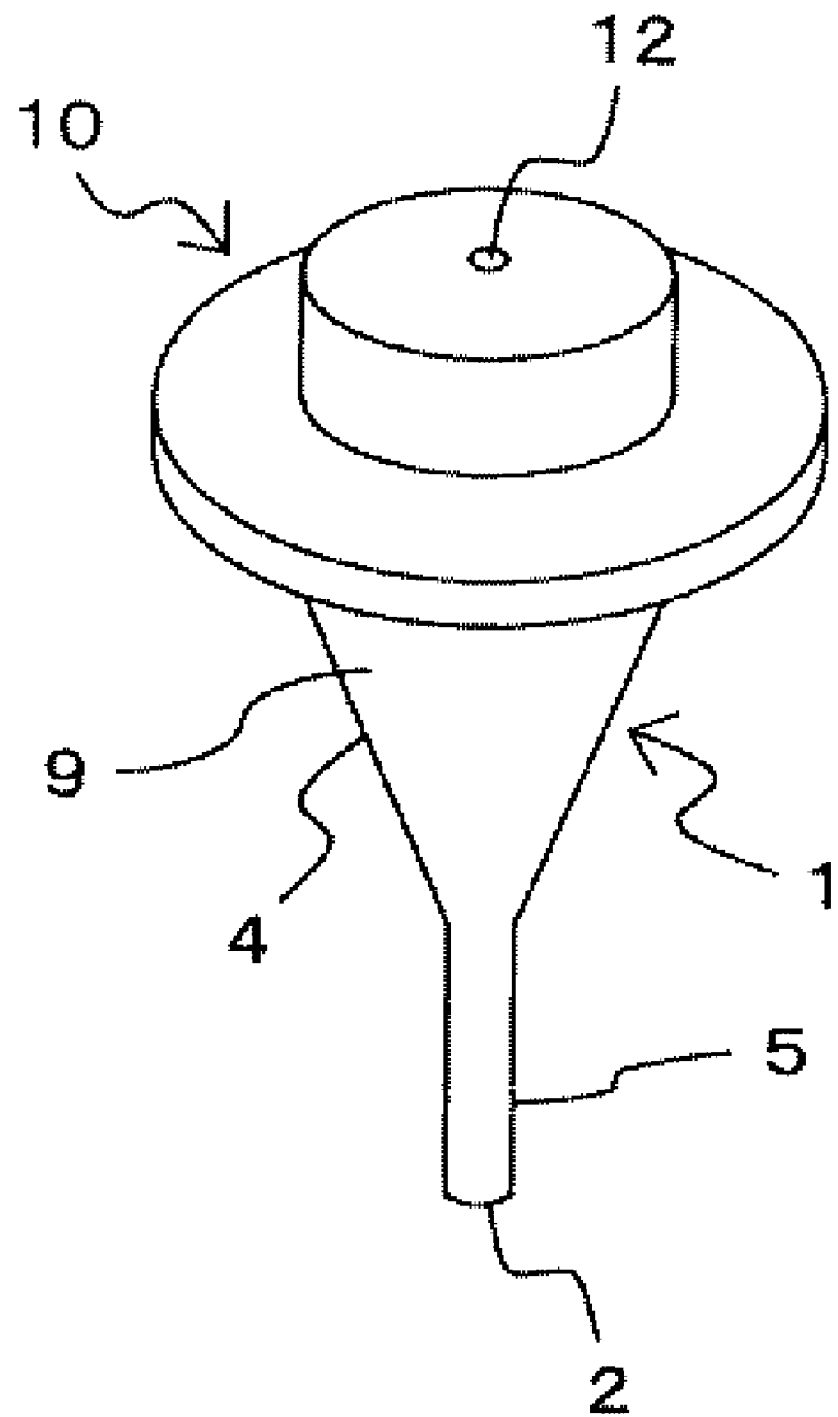
FIG. 1A is an illustration of a schematic perspective view showing an exemplary vacuum suction nozzle according to an embodiment of the present invention.
Figure 1B:
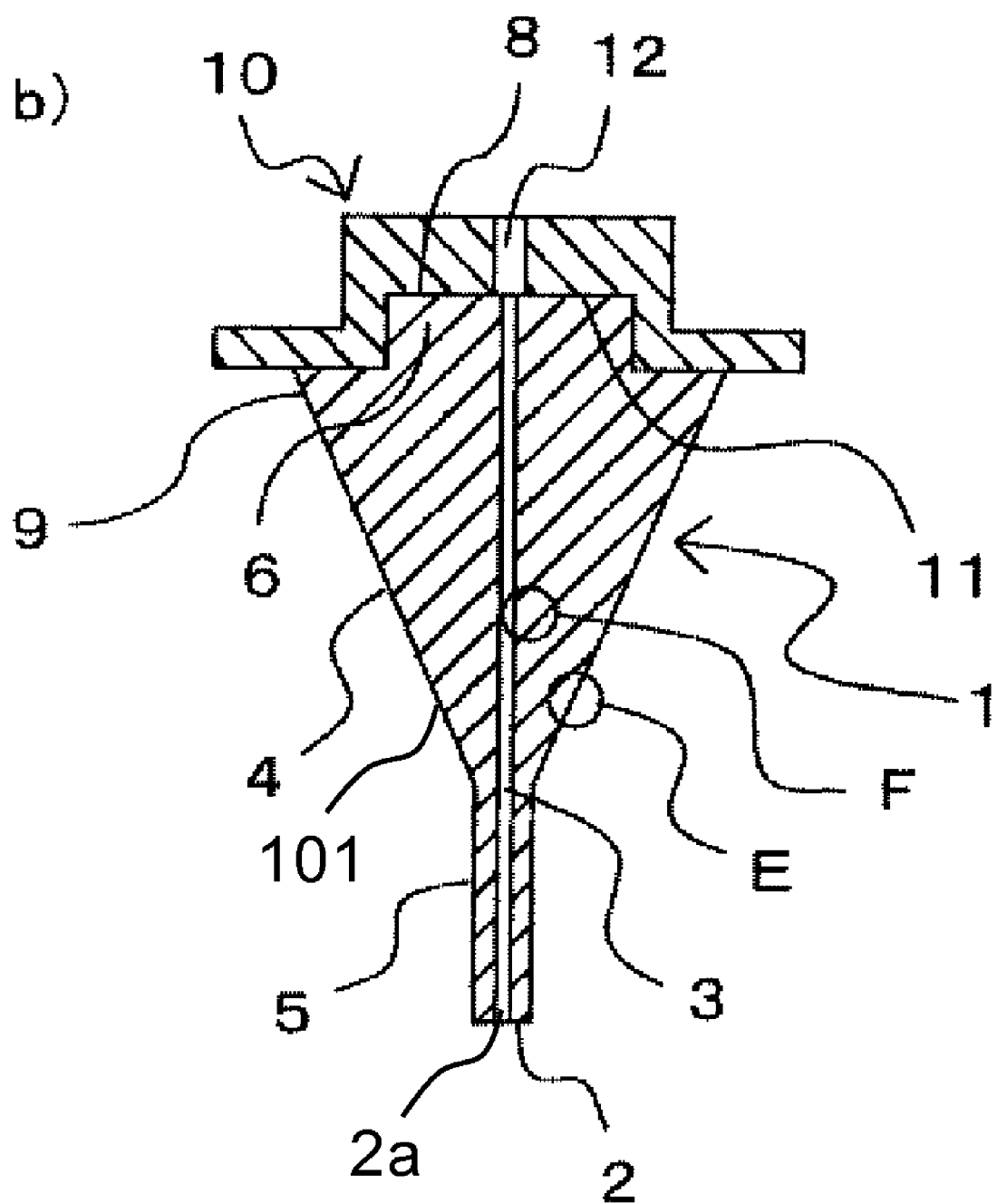
FIG. 1B is an illustration of a schematic longitudinal sectional view showing the vacuum suction nozzle shown in FIG. 1A.
Figure 1C:
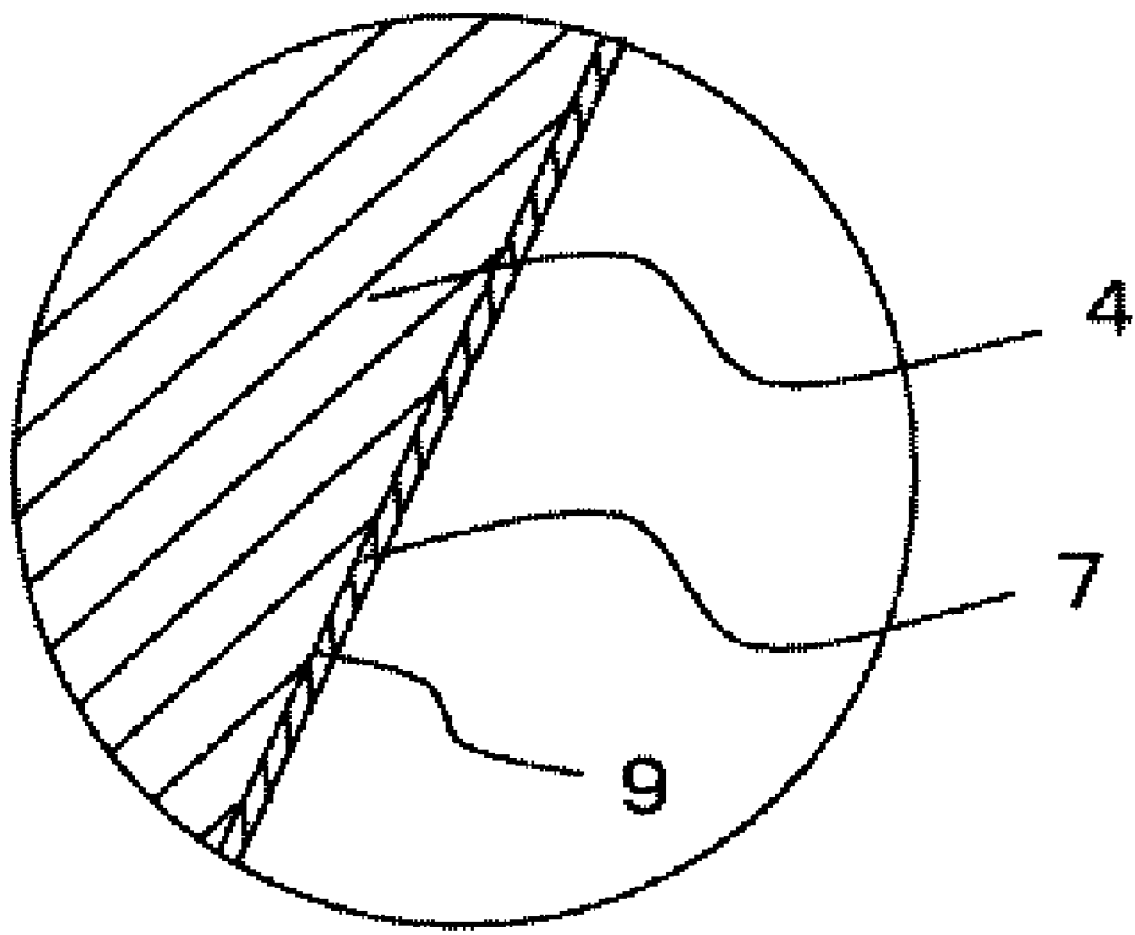
FIG. 1C is an illustration of enlarged schematic view showing a portion E shown in FIG. 1B.
Figure 1D:
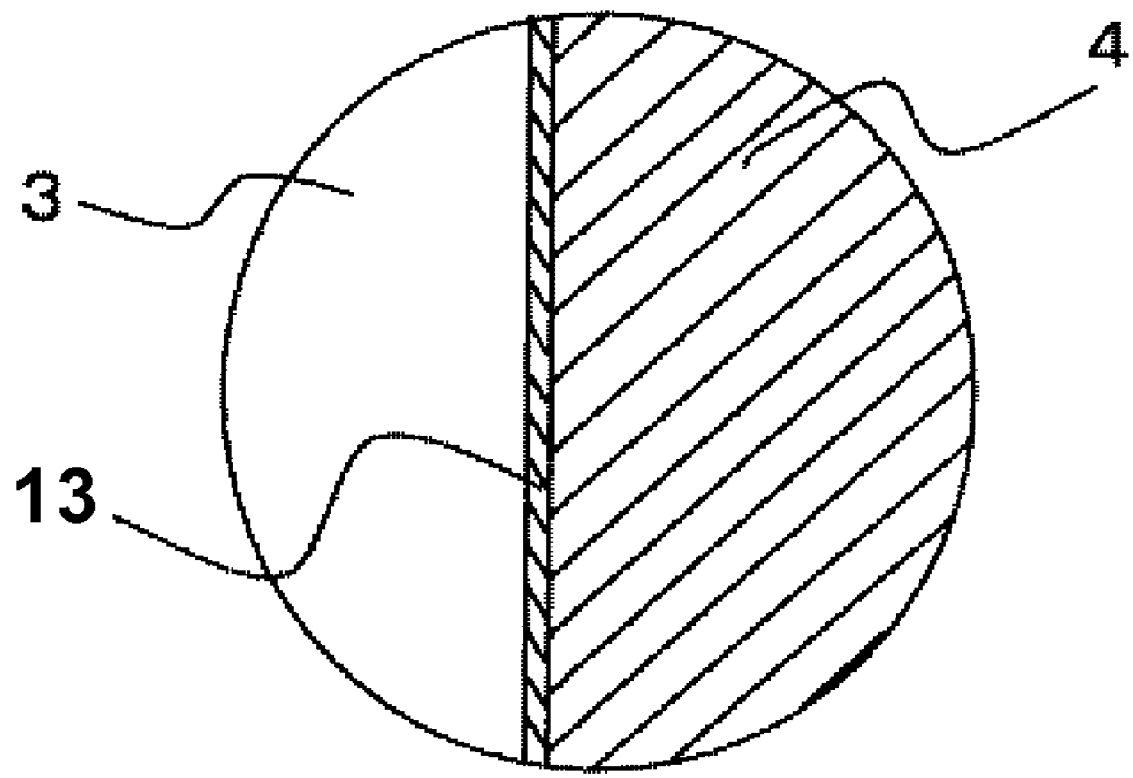
FIG. 1D is an illustration of an enlarged schematic view showing a portion F shown in FIG. 1B.

FIGS. 1A to 1D are illustrations of an exemplary vacuum suction nozzle 1 according to an embodiment of the invention. FIG. 1A is an illustration of a perspective view of the vacuum suction nozzle 1. FIG. 1B is an illustration of a longitudinal sectional view of the vacuum suction nozzle 1. FIG. 1C is an illustration of an enlarged schematic view of a portion E shown in FIG. 1B. FIG. 1D is an illustration of an enlarged schematic view of a portion F shown in FIG. 1B.

The vacuum suction nozzle 1 comprises a ceramic body 101. The ceramic body 101 comprises a front surface 2 (first surface 2), a through hole 3 (first hole 3), and a rear surface 8 (second surface 8). The front surface 2 sucks an object (e.g., an electronic component) using pressure difference between the environment and the through hole 3.

The ceramic body 101 may comprise a conical member 4 (conical portion 4), a cylindrical member 5 (cylindrical portion 5) and a convex portion 6. The cylindrical portion 5 comprises a front surface 2 at an open end. The front surface 2 comprises an opening 2a. The conical portion 4, the cylindrical portion 5, and the convex portion 6 are located in this order from the front surface 2. The conical portion 4 has a larger diameter at the convex portion 6 than that at the front surface 2. The convex portion 6 comprises a rear surface 8. The rear surface 8 is located opposite the front surface 2.

The through hole 3 extends from the front surface 2 to the rear end surface 8 through the cylindrical portion 5, the conical portion 4, and the convex portion 6. The through hole 3 may be a long hole with a small diameter like a capillary. The cross section of the through hole 3 can be, for example but without limitation, a circle, an ellipse, a polygonal shape such as a triangle, a square, a hexagonal shape, a rectangle, a rhomboid, a trapezoidal shape, a octagonal shape, and the like. In addition, a size of the opening 2a or a substantially maximum width of the through hole 3 depends on a size of an object to be sucked (15 in FIG. 2) and may be, for example but without limitation, about 0.7 mm or less. A substantially minimum width of the through hole 3 may be, for example but without limitation, about 0.01 mm.

The vacuum suction nozzle 1 may comprise a holding member 10 comprising a recessed portion 11 into which the convex portion 6 of the vacuum suction nozzle 1, fits in the middle of the holding member 10. A second hole 12 is arranged in a central portion of the recessed portion 11 corresponding to the through hole 3. For example, the holding member 10 is retained on the electronic component mounting device (not shown) by chucking. As a result, the vacuum suction nozzle 1 can be attached to the electronic component mounting device using the holding member 10.

Figure 2:
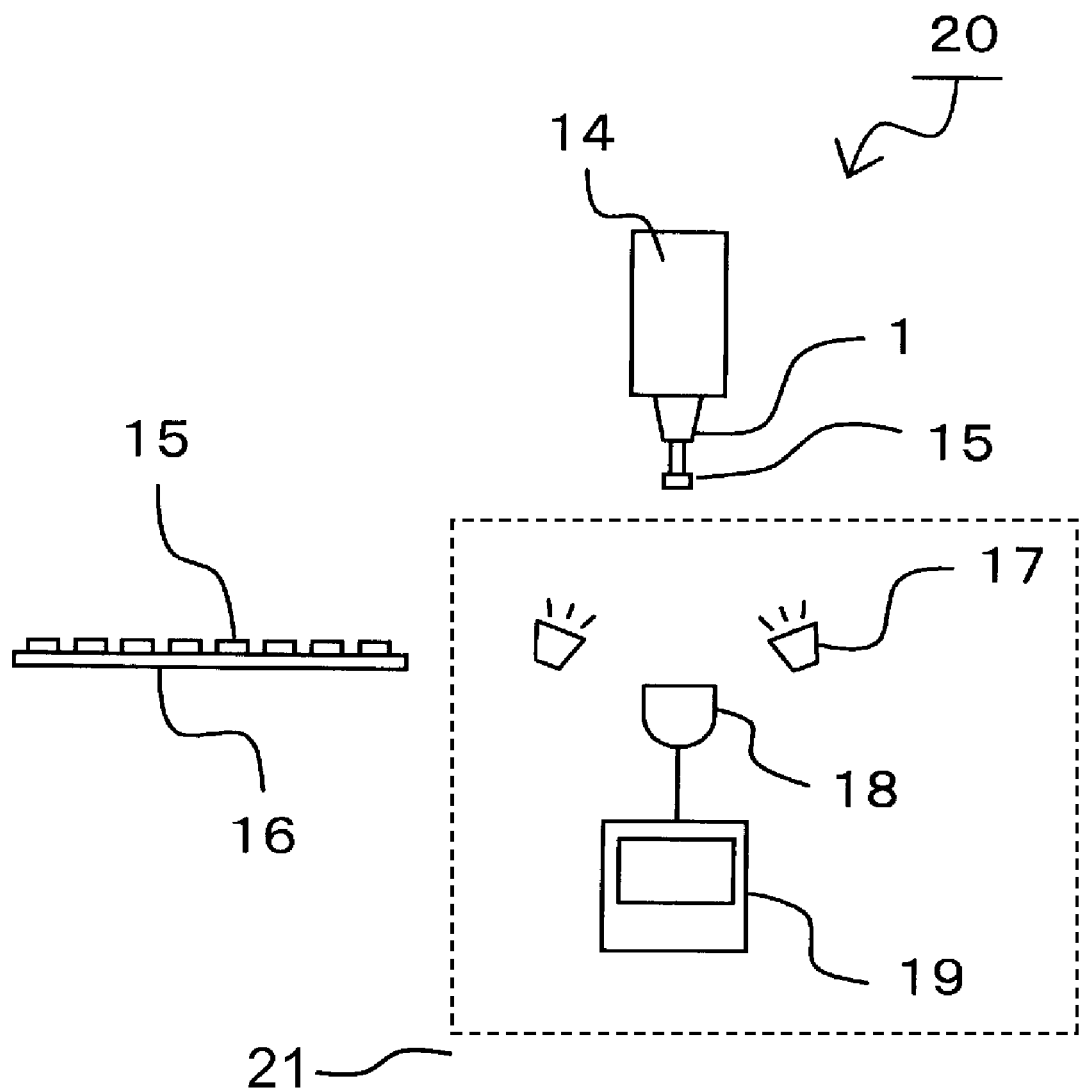
FIG. 2 is an illustration of a schematic view showing a structure of an exemplary electronic component mounting apparatus.

FIG. 2 is an illustration of a schematic view of a structure of an exemplary electronic component mounting apparatus 20 according to an embodiment of the invention. The electronic component mounting apparatus 20 comprises an electronic component mounting device 14 which comprises the vacuum suction nozzle 1 and a measurement optical system 21. The measurement optical system 21 may comprise lights 17, a CCD camera 18, and an image analysis device 19. The lights 17 emit light to an electronic component 15 sucked by the vacuum suction nozzle 1. The CCD camera 18 receives reflected light (image) from the electronic components 15. The reflected light received by the CCD camera 18 is subjected to image processing by the image analysis device 19. A plurality of electronic components 15 may be arranged on a tray 16 and placed in the vicinity of the electronic component mounting apparatus 20.

When the electronic component mounting apparatus 20 is operated, the electronic component mounting device 14 is transferred to the tray 16, and then the vacuum suction nozzle 1 sucks the electronic components 15 on the tray 16. The lights 17 irradiate the electronic components 15 sucked by the vacuum suction nozzle 1 with light. Light reflected from a main body and electrodes of the electronic components 15 is received by the CCD camera 18. An image captured by the CCD camera 18 is analyzed by the image analysis device 19 to determine a substantially precise position of the electronic components 15. Then the vacuum suction nozzle 1 that sucks the electronic components 15 is transferred to a circuit board (not shown). The electronic component 15 is placed on a predetermined position on the circuit board using a position data of the electronic components 15 obtained by the analysis. Then the electronic components 15 are mounted on the circuit board.

In the vacuum suction nozzle 1 of the present invention, the resistance between the front surface 2 and the rear end face 8 (resistance of the vacuum suction nozzle) is in the range of about $10^3$ to about $10^{11} \Omega$, so that static electricity generated on the vacuum suction nozzle 1 can be removed (grounded) to the electronic component mounting device 14 through the rear end face 8. In this manner, problems in which each of the electronic components 15 is moved or blown off when the vacuum suction nozzle 1 approaches the electronic components 15 can be reduced.

In operation, static electricity generated on the vacuum suction nozzle 1 can be transferred to the electronic component mounting device 14 by electrical connection to the electronic component mounting device 14 through the holding member 10 (FIG. 1). Thus, even when the vacuum suction nozzle 1 approaches the electronic components 15 on the tray 16, electrostatic repulsion does not occur between the vacuum suction nozzle 1 and the electronic components 15. In this manner, the blowing off of the electronic components 15 when the vacuum suction nozzle 1 approaches the electronic components 15 is suppressed.

When a resistance of the vacuum suction nozzle 1 is less than $10^3 \Omega$, the conductivity is excessively high. If a member (for example, a table on which a circuit board is placed) around the vacuum suction nozzle 1 is charged, electrostatic discharge is likely to occur from the member to a front end portion (substantially near the suction face 2) of the vacuum suction nozzle 1. If the electrostatic discharge occurs toward the front end portion of the vacuum suction nozzle 1 when the electronic components 15 is being sucked on the front surface 2 of the vacuum suction nozzle 1, the electronic components 15 may be damaged by the electrostatic discharge. In particular, electronic components such as IC with a low withstand voltage is prone to damage by the electrostatic discharge. It is thus important to suppress the electrostatic discharge. Hence, the resistance is preferably at least $10^3 \Omega$ according to an embodiment of the invention.

If a resistance of the vacuum suction nozzle 1 exceeds $10^{11} \Omega$, static electricity is not readily removed from the vacuum suction nozzle 1 to the electronic component mounting device 14. That is, the vacuum suction nozzle 1 may be charged. When the vacuum suction nozzle 1 approaches the electronic components 15, the electronic components 15 may be blown off because of electrostatic repulsion. The resistance of the vacuum suction nozzle 1 is therefore, preferably $10^{11} \Omega$ or less according to an embodiment of the invention.

Furthermore, if the vacuum suction nozzle 1 is charged, the electrostatic discharge is likely to occur from the front end portion of the vacuum suction nozzle 1 to a member around the vacuum suction nozzle 1. The electrostatic discharge from the front end portion of the vacuum suction nozzle 1 may damage the electronic components shown in FIG. 2. For example, the electronic components 15, an electric component mounted on a circuit board, and the like may be damaged due to the electrostatic discharge. However, by setting the resistance of the vacuum suction nozzle 1 to $10^{11} \Omega$ or less the electrostatic discharge is suppressed in the vacuum suction nozzle 1. In this manner, damage due to the electrostatic discharge to the electronic components mentioned above is reduces or eliminated.

The front surface 2 can have any shape suitable for sucking the electronic components 15 (object). Accordingly, shape of the front surface 2, may be, for example but without limitation, substantially circular, substantially elliptical, substantially rectangular, substantially polygonal, and the like.

As described herein, a first direction and a second direction vary depending on the shape of the suction face 2. For example, if the shape of the front surface 2 is substantially elliptical, then direction of the minor axis is defined as the first direction, and the direction of the major axis is defined as the second direction. Similarly, if the shape of the front surface 2 is substantially rectangular, the direction of the width is defined as the first direction, and the direction of the length is defined as the second direction. In the same manner, if the shape of the front surface face 2 is substantially square, any of the two sides substantially perpendicular to each other is defined as the first direction or the second direction. If the shape of the front surface 2 is circular, any direction through the center of the circle is defined as the first direction, and a direction perpendicular to the first direction is defined as the second direction. That is, if the shape of the front surface 2 is circular, each dimension M1 and M2 is equal to the diameter.

If the dimension M1 and/or dimension M2 of the front surface 2 of the vacuum suction nozzle 1 is about 0.7 mm or less, the front surface 2 of the vacuum suction nozzle 1 is less likely to come into contact with a mounted electronic component, or the like, when each of the electronic components 15 is mounted on a circuit board. In this manner, damage to the mounted electronic components 15, or the like, due to contact with the vacuum suction nozzle 1 is reduced or eliminated. Furthermore, damage to the front surface 2 of the vacuum suction nozzle 1 due to contact with the mounted electronic component, or the like, can also be reduced or eliminated.

If both dimensions M1 and M2 of the front surface 2 of the vacuum suction nozzle 1 exceed about 0.7 mm, the front surface 2 is more likely to come into contact with an electronic component, or the like, mounted on a circuit board. For example, small electronic components 15 each having a side of 1 mm or less (e.g., 0603-type electronic components with 0.6 mm×0.3 mm dimensions) have been mounted on circuit boards so as to be spaced at about 0.1 to about 0.2 mm. That is, the spacing between mounted electronic components may be as small as about 0.8 mm at a position where each of the electronic components 15 is mounted. Thus, if the dimension of the front surface 2 of the vacuum suction nozzle 1 exceeds about 0.7 mm, the front surface 2 of the vacuum suction nozzle 1 is more likely to come into contact with the mounted electronic component, and the like. In particular, if the electronic components 15 is sucked by the vacuum suction nozzle 1, even slight displacement (e.g., 0.1 mm) of a position of each of the electronic components 15 from an optimum position with respect to the front surface 2 may bring the front surface 2 of the vacuum suction nozzle 1 into contact with, for example, the mounted electronic component. This may result in damage to, for example, the mounted electronic component and chipping of the front surface 2 of the vacuum suction nozzle 1. Thus, dimensions M1 and M2 of the front surface 2 of the vacuum suction nozzle 1 may be preferably about 0.7 mm or less.

If one of the dimensions M1 and M2 of the front surface 2 of the vacuum suction nozzle 1 is about 0.7 mm or less, the vacuum suction nozzle 1 may be used in such a manner that a direction of smaller spacing between the mounted electronic components accords with the first direction (direction of measurement of dimension M1), thereby avoiding contact of the mounted electronic components and the front surface 2 of the vacuum suction nozzle 1. Furthermore, if one dimension (e.g., dimension M2) exceeds about 0.7 mm, causes an increase in mechanical strength of the cylindrical portion 5, which is preferable.

The front surface 2 of the vacuum suction nozzle 1 may preferably have a substantially maximum dimension of about 0.7 mm or less in at least one of a first direction (dimension M1) and a second direction (dimension M2) orthogonal to the first direction. For example, if the dimension M1 is about 0.7 mm or less, the dimension M2 may be greater than about 0.7 mm.

Repetition of attachment and detachment of the electronic components in an existing vacuum suction nozzle cab cause its front surface to wear out and cause a gap between the front surface and a corresponding one of the electronic components, thereby reducing a vacuum suction force. Thus, the vacuum suction nozzle may need to be replaced. In contrast, the vacuum suction nozzle 1 according to an embodiment of the invention comprises a ceramic material that has a good wear resistance. In this manner, the repetition of attachment and detachment of the electronic components 15 does not cause the front surface 2 of the vacuum suction nozzle 1 to wear out. Therefore, the vacuum suction nozzle 1 can suppress wearing of the front surface 2 for prolonged periods of time so as to obtain a long operating lifetime.

Figure 3:
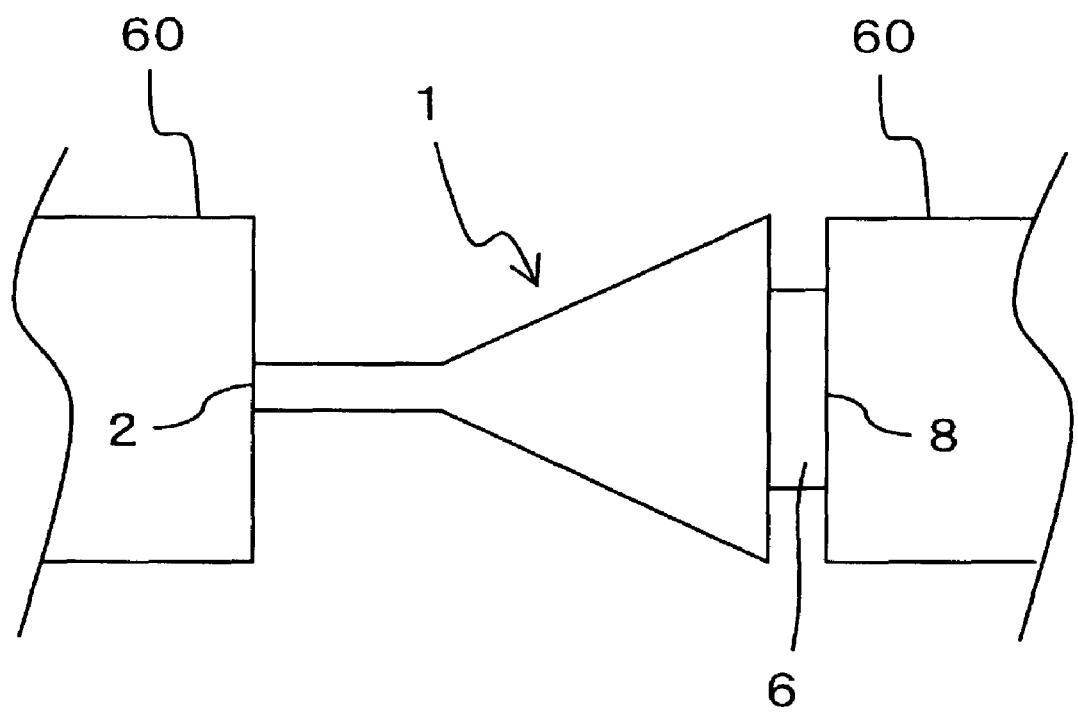
FIG. 3 is an illustration of schematic view showing an exemplary structure for measuring a resistance between a suction face and a rear end face of the vacuum suction nozzle.

FIG. 3 is an illustration of a schematic cross section of a measuring system for measuring the resistance of the vacuum suction nozzle 1. To measure the resistance, two electrodes 60 facing each other and a device for measuring electrical resistance (not shown) are used. First, one of the electrodes 60 is brought into contact with the front surface 2 of the vacuum suction nozzle 1, and the other electrode 60 is brought into contact with the rear end face 8 (end face of the projecting portion 6). Then the resistance between the front surface 2 and the rear end face 8 of the vacuum suction nozzle 1 is measured with a device for measuring electrical resistance such as an ohmmeter. The device for measuring electrical resistance can measure the resistance in response to an applied voltage. The applied voltage can be adjusted in response to, for example, the shape and material of the vacuum suction nozzle 1. For the vacuum suction nozzle 1 of the present invention, the measurement is suitably performed at a voltage of about 10 to about 1500 V.

In particular, the vacuum suction nozzle 1 more preferably has a resistance of $10^5$ to $10^8 \Omega$. As described below, the vacuum suction nozzle 1 with a resistance within the above range is suitable for use in the electronic component mounting apparatus 20 that can achieve high-speed mounting.

To increase the mounting speed of the electronic components 15, it is desirable to use the electronic component mounting apparatus 20 that can achieve high-speed mounting. To achieve high-speed mounting, however, it is necessary to reduce the time (for example, about 0.2 seconds or less) required for the attachment-detachment cycle of the electronic components 15. The time required for the attachment-detachment cycle of the electronic components 15, comprises time taken to suck a corresponding one of the electronic components 15 on the tray 16, place it on a circuit board, and suck the next electronic component 15 on the tray 16. Furthermore, the vacuum suction nozzle 1 is readily charged when the vacuum suction nozzle 1 sucks the electronic component 15 on the tray 16. The charged static electricity needs to be discharged by the time the vacuum suction nozzle 1 is transferred onto the circuit board. Furthermore, static electricity newly charged after the electronic components 15 is arranged on the circuit board needs to be discharged by the time the next electronic components 15 is sucked on the tray 16. Thus, static electricity generated on the vacuum suction nozzle 1 needs to be sufficiently removed in a short time until the electronic components 15 are sucked. That is, it is desirable to provide the vacuum suction nozzle 1 in which static electricity can efficiently be removed in a very short period of time.

Furthermore, to reduce the time required for the attachment-detachment cycle of the electronic components 15, the vacuum suction nozzle 1 travels at high speed. A higher travel speed of the vacuum suction nozzle 1 results in an increase in the frictional resistance between the vacuum suction nozzle 1 and air, thereby increasing the amount of static electricity generated by friction between the vacuum suction nozzle 1 and air. It is thus desirable to provide the vacuum suction nozzle 1 in which a larger amount of static electricity can be removed in a short period of time.

A resistance of the vacuum suction nozzle 1 of $10^8 \Omega$ or less permits removal of an increased amount of static electricity in a very short time and is thus preferred. That is, even when the vacuum suction nozzle 1 having a resistance of $10^8 \Omega$ or less is used in the electronic component mounting apparatus 20 that can achieve high-speed mounting, it is possible to sufficiently suppress the electrostatic charging of the vacuum suction nozzle 1.

If the vacuum suction nozzle 1 has a resistance exceeding $10^8 \Omega$, it is difficult to sufficiently remove static electricity during the attachment-detachment cycle having a duration of about 0.2 seconds or less. Thus, electrostatic repulsion acting between the vacuum suction nozzle 1 and each of the electronic components 15 is likely to move each of the electronic components 15 when the vacuum suction nozzle 1 sucks each of the electronic components 15 on the tray 16. The electronic components 15 may be sucked by the vacuum suction nozzle 1 while the position of the electronic component 15 is being displaced from a target position with respect to the vacuum suction nozzle 1. In this case, the electronic components 15 may be dropped onto the circuit board because of an insufficient suction force. Furthermore, if a high electrostatic repulsion acts between the vacuum suction nozzle 1 and the electronic components 15, the electronic components 15 are likely to be blown off. Thus, an upper limit of the resistance of the vacuum suction nozzle 1 may be preferably about $10^8 \Omega$.

In the case, where a lower limit of the resistance of the vacuum suction nozzle 1 is about $10^5 \Omega$, discharge from the member around the vacuum suction nozzle 1 to the front end portion of the vacuum suction nozzle 1 is further suppressed and is thus preferred. In particular, in the case where the electronic components 15 such as IC with a low withstand voltage is sucked and transferred, it is desirable to use the vacuum suction nozzle 1 having a resistance of about $10^5 \Omega$ or more.

If the vacuum suction nozzle 1 has a resistance of about $10^5$ to about $10^8 \Omega$, the resistance is suitably measured at an applied voltage of about 10 to about 50 V. The vacuum suction nozzle 1 has high discharge efficiency. Thus, when the electronic components 15 are attached or detached, static electricity is almost removed. In operation, the voltage of static electricity may be up to about 50 V. Thus, to determine the resistance at a voltage close to a voltage in the operation, the applied voltage may be set to about 50 V or less. That is, when the resistance at a voltage of about 10 to about 50 V is in the range of $10^5$ about to about $10^8 \Omega$, the blowing off of the electronic components 15 and damage to the electronic components 15 by electrostatic discharge can be effectively suppressed.

The ceramic material used for the vacuum suction nozzle 1 (ceramic body) preferably contains a conductivity-imparting material. In general, a ceramic material is an insulator. The addition of a conductivity-imparting material to the ceramic material can reduce the resistance of the ceramic material. Furthermore, the resistance can be adjusted by a type and amount of the conductivity-imparting material. Hence, the ceramic material containing the conductivity-imparting material is suitably selected to produce the vacuum suction nozzle 1 according to an embodiment of the invention.

For example, a relatively inexpensive insulating ceramic material with a good wear resistance, such as but without limitation, alumina ($Al_2O_3$) can be used. Addition of a conductivity-imparting material, such as but without limitation, titanium carbide (TiC) or titanium nitride (TiN), to the alumina ceramic material can reduce the resistance of the alumina ceramic material. In this manner, the alumina ceramic material containing the titanium carbide or titanium nitride can suitably produce the vacuum suction nozzle 1 with a good wear resistance.

Moreover, Zirconia ($ZrO_2$) is also an insulating ceramic material and is advantageous in that zirconia has high strength and can form a tough slender structure. Addition of a conductivity-imparting material, such as but without limitation, iron oxide ($Fe_2O_3$) can reduce the resistance of the zirconia ceramic material. In this manner, the zirconia ceramic material containing, for example, iron oxide can suitably produce the vacuum suction nozzle 1 having an elongated front end portion.

Furthermore, silicon carbide (SiC) is a ceramic material having conductivity and good heat dissipation. However, the volume resistivity of silicon carbide may be too high for use in the vacuum suction nozzle 1. Thus, the addition of a conductivity-imparting material, such as but without limitation, carbon to the silicon carbide ceramic material can reduce the resistivity of the silicon carbide ceramic material. In this manner, the silicon carbide ceramic material containing carbon can suitably produce the vacuum suction nozzle 1 having good heat dissipation.

As shown in FIG. 1C, a side face 9 of the vacuum suction nozzle 1 is preferably covered with a conductive layer 7. The conductive layer 7 comprises a ceramic material containing a conductivity-imparting material or a layer composed of a conductivity-imparting material. The side face 9 of the vacuum suction nozzle 1 comprises a side face of the conical portion 4 and a side face of the cylindrical portion 5.

In this manner, covering the side face of the vacuum suction nozzle 1 with the conductive layer 7 results in removal of static electricity generated on the vacuum suction nozzle 1 through not only the vacuum suction nozzle 1 but also the conductive layer 7, and advantageously improves the removal efficiency of static electricity from the vacuum suction nozzle 1.

As shown in FIG. 1D, furthermore, an inner wall of the suction hole 3 passing through the vacuum suction nozzle 1 is preferably covered with a conductive layer 13 as well as the side face 9 of the vacuum suction nozzle 1. When the electronic components 15 are vacuum-sucked, air flows through the suction hole 3; hence, static electricity is also generated by friction between an inner wall of the through hole 3 and air. The conductive layer 13 covering the inner wall of the through hole 3 is effective in efficiently removing the generated static electricity.

To remove static electricity through the conductive layers 7 and 13, preferably, the conductive layers 7 and 13 are electrically connected to the electronic component mounting device 14. For example, the conductive layers 7 and 13 are allowed to extend to the rear end face 8 of the vacuum suction nozzle 1 to be brought into contact with the holding member 10, thereby removing static electricity to the electronic component mounting device 14 through the holding member 10.

In the embodiment shown in FIG. 1C, the conductive layer 7 comprises a ceramic material comprising a conductivity-imparting material or a conductivity-imparting material. The ceramic material comprising the conductivity-imparting material may comprise, for example but without limitation, titanium carbide, alumina containing titanium nitride or the like, zirconia comprising iron oxide, and silicon carbide comprising carbon. The conductivity-imparting material may comprise, for example but without limitation, titanium carbide, titanium nitride, silicon carbide, carbon, and the like. The conductive layer 7 can be formed by various methods. For example, the conductive layer 7 can be formed of a precipitate from the vacuum suction nozzle 1.

In the case where the conductive layer 7 is a precipitate from the vacuum suction nozzle 1, a clear boundary is not formed between the vacuum suction nozzle 1 and the conductive layer 7, so that the vacuum suction nozzle 1 can be strongly bonded to the conductive layer 7. As a result, the conductive layer 7 is not readily detached and improved in durability. Note that although the conductive layer 7 is formed by precipitating the conductivity-imparting material in the ceramic material constituting the vacuum suction nozzle 1, the conductivity-imparting material may not be precipitated in its entirety. That is, portions of the conductivity-imparting material may remain in the vacuum suction nozzle 1. Thus, static electricity generated on the vacuum suction nozzle 1 is removed through the vacuum suction nozzle 1 and the conductive layer 7.

In the case where the conductive layer 7 is formed of the precipitate, an amount of added conductivity-imparting material to the ceramic material is suitable determined to reduce the amount of the conductivity-imparting material in the ceramic material due to precipitation. However, an excessively large amount of the added conductivity-imparting material to the ceramic material may cause a reduction in the strength of the ceramic material. Thus, the amount of the added conductivity-imparting material to the ceramic material is preferably in a range of about 10% by mass to about 40% by mass. If an amount of the added conductivity-imparting material is less than about 10% by mass, the conductivity-imparting material may not be precipitated; thereby the conductive layer 7 may not be formed. So the amount of the added conductivity-imparting material less than about 10% by mass and is not preferable. The amount of the added conductivity-imparting material exceeding about 40% by mass is also not preferable, since it may result in a reduction in the strength of the ceramic material. Alternatively, the conductive layer 7 may be formed by coating.

The conductive layer 7 composed of any of various materials can be formed by coating the side face 9 of the vacuum suction nozzle 1 with a material constituting the conductive layer 7. Thus, the conductive layer 7 having desirable properties, e.g., conductivity, adhesion, flexibility, and sufficient durability, can be formed. In particular, the conductive layer 7 formed by the coating has an advantage over the conductive layer 7 formed by the precipitation method described above in that a substantially large number of choices of materials can be used for forming the conductive layer 7 by the coating.

In the case where the conductive layer 7 is formed by the coating, a material usable for the conductive layer 7 may be relatively freely selected. For example, selection of a material having good adhesion to the vacuum suction nozzle 1 is preferred because the conductive layer 7 may not be readily detached. Furthermore, selection of a material having a low reactivity to the electronic components 15 transported is preferred because there is no risk of adversely affecting the electronic component 15. The conductive layer 7 can be composed of a ceramic material, for example but without limitation, alumina, zirconia, or silicon nitride, and the like, or a conductivity-imparting material, for example but without limitation, carbon, copper, chromium, nickel, titanium nitride, titanium carbide, silicon carbide, and the like.

A method of coating comprises, for example but without limitation, common known film-forming methods, such as a chemical vapor deposition (CVD) method, a physical vapor deposition (PVD) method, a plating method, and an application method.

For example, if the CVD method is used, the vacuum suction nozzle 1 is placed in a reactor. A gas containing a coating material component (conductivity-imparting material) is introduced thereinto. Then the gas is reacted on a surface (side face 9) of the vacuum suction nozzle 1 to form the conductive layer 7. In particular, as a method for covering the inner wall of the through hole 3 with the conductive layer 13, the CVD method is preferred.

In the case of using a physical vapor deposition method, the vacuum suction nozzle 1 is placed in a vacuum chamber. A target composed of a coating material (conductivity-imparting material) is arranged so as to face the vacuum suction nozzle 1. Argon gas is charged into the vacuum chamber. The energy of discharge forms argon ions. The bombardment of the target with the argon ions evaporates atoms constituting the target. The atoms are deposited on the surface (side face 9) of the vacuum suction nozzle 1, thereby forming the conductive layer 7.

In the case of employing an application method, paint containing the conductivity-imparting material is applied to the surface (side face 9) of the vacuum suction nozzle 1 and dried or baked, thereby forming the conductive layer 7.

As the paint containing the conductivity-imparting material, a coating material containing a conductivity-imparting material dispersed in rubber or a resin as a base material may be used. The coating material is applied to the side face 9 of the vacuum suction nozzle 1 and dried or cured, thereby forming the conductive layer 7.

In the case of employing a plating method, in general, an electroplating method is suitable. The conductivity of the vacuum suction nozzle 1 composed of a ceramic material, however, is not so high; hence, it is difficult to form a film by electroplating. Thus, a conductive base is formed on the side face 9 of the vacuum suction nozzle 1 by electroless plating in advance. Electroplating can be performed by energizing the conductive base.

In the electroplating method, the vacuum suction nozzle 1 is immersed in a plating bath in which ions of the conductivity-imparting material are dissolved. A metal plate through which a current flows is connected to a positive electrode. The conductive base on the vacuum suction nozzle 1 is connected to a negative electrode, and then a current is allowed to flow. Thereby, the conductive layer 7 can be formed on the side face 9 of the vacuum suction nozzle 1. A boundary is formed between the conductive layer 7 formed by coating and the vacuum suction nozzle 1. Thus, the conductive layer 7 formed by the coating may be more susceptible to detachment, than the conductive layer 7 formed by precipitation. In particular, if the vacuum suction nozzle 1 is deformed, detachment or cracking may occur. However, the vacuum suction nozzle 1 of the present invention, comprises a ceramic material that is not readily deformed; hence, occurrence of detachment or cracking of the conductive layer 7 is reduced or eliminated. The ceramic material used for the vacuum suction nozzle 1 is, for example but without limitation, a black ceramic material.

The electronic components 15 sucked by the vacuum suction nozzle 1 is irradiated with light from the lights 17. An image thereof is captured with the CCD camera 18. The resulting bright image of the electronic components 15 is displayed. Since the vacuum suction nozzle 1 comprising the black ceramic material is arranged behind the electronic components 15, an outline of the electronic components 15 is clearly captured. Thus, the image analysis device 19 can accurately recognize the shape of the electronic components 15, thereby advantageously improving position accuracy required for arranging the electronic components 15 on the circuit board. The black ceramic material may comprise, for example but without limitation, zirconia, alumina, and silicon carbide containing a black conductivity-imparting material, and the like. The vacuum suction nozzle 1 may be formed of a ceramic material of a chromatic color. In particular, a ceramic material of, for example but without limitation, a dark color such as brown or blue may provide the same effect as the black ceramic material. With respect to the color (hue, lightness, and color saturation) of the ceramic material used for the vacuum suction nozzle 1, an optimal color is preferably selected in response to the color of the electronic components 15. That is, the color of the ceramic material used for the vacuum suction nozzle 1 is preferably determined in such a manner that a clear outline of the electronic components 15 is obtained when the electronic components 15 are photographed with the CCD camera 18. In general, in the case where the color of the vacuum suction nozzle 1 is darker than the color of the electronic components 15, it is easy to distinguish between the vacuum suction nozzle 1 and the electronic components 15.

Use of the vacuum suction nozzle 1 of a proper color results in a clear outline of the electronic components 15 photographed with the CCD camera 18. As a result, an analysis error of the image analysis device 19 can be reduced or eliminated, thereby improving position accuracy required for arranging the electronic components 15 on the circuit board.

As described above, in the case where the vacuum suction nozzle 1 comprising the ceramic material containing a conductivity-imparting material, the color of the ceramic material can be changed by the type of conductivity-imparting material added.

For example, to obtain a dark colored ceramic material, a conductivity-imparting material comprising at least one of, for example but without limitation, iron oxide, cobalt oxide, chromium oxide, nickel oxide and the like may be added. When the ceramic material contains iron oxide, the color of the ceramic material is substantially a dark black color. When the ceramic material contains cobalt oxide, the ceramic material is substantially a dark blue color. When the ceramic material contains chromium oxide or nickel oxide, the ceramic material is substantially a dark green color. To obtain a substantially gray ceramic material, a conductivity-imparting material containing titanium oxide may be added. To obtain a yellow ceramic material, a conductivity-imparting material containing zinc oxide may be added.

In many cases, the color of the electronic components 15 is generally white, silver, or gray. Thus, the vacuum suction nozzle 1 of black or a dark color is preferred. For example, to obtain the vacuum suction nozzle 1 of black color, a ceramic material containing about 65% by mass zirconia, about 30% by mass iron oxide, about 3% by mass cobalt oxide, and about 2% by mass chromium oxide may be used.

In the case of the electronic components 15 of silver color, the vacuum suction nozzle 1 of a dark black color can be preferred. A specific example of the material in order to obtain the vacuum suction nozzle 1 is a ceramic material comprising about 25% by mass or more iron oxide. The vacuum suction nozzle 1 (FIG. 1A) comprises the elongated cylindrical portion 5 on the front surface 2 side. Thus, if the ceramic material used for the vacuum suction nozzle 1 has low mechanical strength, the cylindrical portion 5 may be fragile. The vacuum suction nozzle 1 comprising the zirconia ceramic material with high mechanical strength has the advantage that the cylindrical portion 5 is not easily damaged.

The ceramic material used for the vacuum suction nozzle 1 according to this embodiment is preferably zirconia containing a stabilizer with high mechanical strength. The stabilizer may comprise, for example but without limitation, $Y_2O_3$ (yttria), CaO, $CeO_2$ (ceria), $Dy_2O_3$, $Er_2O_3$, MgO (magnesia), and the like. In particular, use of a compound comprising the yttrium (Y) as the stabilizer stabilizes a crystal phase of the zirconia to further improve the mechanical properties and is thus preferable. A zirconia ceramic material having sufficient mechanical strength can be obtained by using about 2% to about 8% by mole of the stabilizer. In addition, the zirconia preferably has an average crystal grain size of about 3 μm or less. In this manner, the crystal grains are not readily detached when the front surface 2 is subjected to grinding or mirror polishing to produce or repair the vacuum suction nozzle 1. Therefore, the front surface 2 is not readily chipped.

Particularly preferably, the vacuum suction nozzle 1 of the present invention is composed of a ceramic material comprising about 65% to about 80% by mass of the zirconia comprising the stabilizer and about 20% to about 35% by mass of an iron oxide, a chromium oxide, and a titanium oxide, in total, as the conductivity-imparting material.

As described above, the zirconia ceramic material comprising the stabilizer has a high mechanical strength suitable to produce the vacuum suction nozzle 1. The use of the iron oxide, the chromium oxide, and the titanium oxide as the conductivity-imparting material results in suppression of a grain growth of the conductivity-imparting material during firing the ceramic material, thereby suppressing the detachment of grains and the chipping of edges when the front surface 2 is subjected to grinding.

The grain growth of the conductivity-imparting may be caused by the chromium oxide and the titanium oxide reacting with impurities in the iron oxide and the zirconia to form compounds and that the resulting compound suppresses the grain growth of the conductivity-imparting material (in particular, the grain growth of iron oxide).

An amount of the conductivity-imparting material added less than about 20% by mass is unlikely to sufficiently reduce the volume resistivity of the ceramic material. An amount of the conductivity-imparting material added exceeding about 35% by mass may cause a reduction in the zirconia content of the ceramic material, thereby reducing the mechanical properties of the vacuum suction nozzle 1.

Furthermore, the conductivity-imparting material preferably contains about 70% to about 99.5% by mass iron oxide, about 0.4% to about 20% by mass chromium oxide, and about 0.1% to about 10% by mass titanium oxide. An iron oxide content of less than about 70% by mass reduces the effect of decreasing the volume resistivity of the ceramic material. An iron oxide content exceeding about 99.5% by mass results in excessively low proportions of chromium oxide and titanium oxide, thereby failing to suppress the grain growth of iron oxide during firing of the ceramic material. As a result, the vacuum suction nozzle 1 may have reduced mechanical properties.

A titanium oxide content of less than about 0.1% by mass may fail to sufficiently reduce the proportion of the monoclinic crystal phase on the surface of the vacuum suction nozzle 1, which may reduce the processability of the surface. A titanium oxide content exceeding about 10% by mass may cause the grain growth of the zirconia, which may reduce the mechanical properties of the vacuum suction nozzle 1.

A chromium oxide content of less than about 0.4% by mass may not suppress the grain growth of the iron oxide during firing, which may reduce the mechanical properties of the vacuum suction nozzle 1. A chromium oxide content exceeding about 20% by mass may result in a reduction in the sinterability of the zirconia ceramic material because of difficulty in the sintering of the chromium oxide. Thus, a dense zirconia ceramic material is not obtained, which may reduce the mechanical properties of the vacuum suction nozzle 1. A method for producing the vacuum suction nozzle 1 is described below.

The vacuum suction nozzle 1 may be formed of a ceramic material comprising, for example but without limitation, silicon carbide, alumina, zirconia containing a stabilizer, and the like. In the case of using alumina or zirconia containing a stabilizer, a conductivity-imparting material containing at least one of for example but without limitation, iron oxide, cobalt oxide, chromium oxide, nickel oxide, and the like may be used. Alternatively, a conductivity-imparting material containing, for example but without limitation, titanium carbide or titanium nitride may be used.

Two production examples of the vacuum suction nozzle 1 using the silicon carbide, and yttria-stabilized zirconia respectively are described below.

First, production example of vacuum suction nozzle 1 using Silicon Carbide ceramic material is described.

A raw material mixture of 95% by mass of silicon carbide and 5% by mass of alumina serving as a sintering agent is charged into a ball mill. The mixture is pulverized so as to have a predetermined particle size, forming slurry. The slurry is spray-dried with a spray dryer to form granules.

Next, the resulting granules and a thermoplastic resin are charged into a kneader and kneaded under heat. The resulting mixture is charged into a pelletizer to form pellets for use in injection molding. An ethylene-vinyl acetate copolymer, polystyrene, or an acrylic resin may be used as the thermoplastic resin charged into the kneader. An amount of thermoplastic resin added is in the range of about 10% to about 25% by mass with respect to the mass of the ceramic material. The heating temperature when kneading is performed with the kneader is in the range of 140° C. to 180° C. Furthermore, kneading conditions may be appropriately determined in response to the type and particle size of ceramic material and the type of thermoplastic resin.

The resulting pellets are charged into an injection molding machine and molded by injection molding to form a formed article of the vacuum suction nozzle 1. After a runner is separated from the resulting formed article, the formed article is calcined.

The formed article is then sintered in a vacuum atmosphere or an inert gas atmosphere, e.g., argon or helium, at a substantially maximum temperature of 1900° C. to 2200° C. for a holding time of 1 to 5 hours.

The sintering conditions can be changed in response to the conductivity-imparting material, imparting proper conductivity to the vacuum suction nozzle 1. For example, if the conductivity-imparting material contains iron oxide, cobalt oxide, chromium oxide, and nickel oxide, sintering is performed in an air atmosphere at a substantially maximum temperature of 1300° C. to 1500° C. for a holding time of 1 to 5 hours. If the conductivity-imparting material is titanium carbide, sintering is performed in a vacuum atmosphere or an inert gas atmosphere at a substantially maximum temperature of 1400° C. to 1800° C. for a holding time of 1 to 5 hours. If the conductivity-imparting material is titanium nitride, sintering is performed in a vacuum atmosphere, an inert gas atmosphere, or a nitrogen atmosphere at a substantially maximum temperature of 1400° C. to 1800° C. for a holding time of 1 to 5 hours.

The sintered vacuum suction nozzle 1 is polished by barrel finishing or the like. With respect to the as-sintered vacuum suction nozzle 1, physical properties of the surface (case) may be different from physical properties of the inside. Thus, removal of the surface results in the vacuum suction nozzle 1 having uniform physical properties.

Second, production example of vacuum suction nozzle 1 using yttria-stabilized zirconia is described.

A raw material mixture of 65% by mass of zirconia containing yttria serving as a stabilizer and 35% by mass of iron oxide is charged into a ball mill. The mixture is pulverized so as to have a predetermined particle size, forming a slurry. The slurry is spray-dried with a spray dryer to form granules.

Next, the resulting granules and a thermoplastic resin are charged into a kneader and kneaded under heat. The resulting mixture is charged into a pelletizer to form pellets for use in injection molding.

The resulting pellets are charged into an injection molding machine and molded by injection molding to form a formed article of the vacuum suction nozzle 1. The resulting formed article is calcined.

The formed article is sintered in an air atmosphere at a maximum temperature of 1300° C. to 1500° C. for a holding time of 1 to 5 hours.

In the sintering process, a conductive layer 7 can be precipitated by setting a temperature to 1300° C. to 1400° C. for 1 to 5 hours. In an embodiment, before the sintering temperature, which is often the maximum temperature in the sintering process, the formed articles are heated to a temperature range from 50° C. to 100° C. lower than the sintering temperature for 1 to 3 hours.

EXAMPLE 1

Samples 1 to 5 were prepared as follows.

Water was added to a raw-material mixture containing silicon carbide, alumina serving as a sintering agent, and carbon serving as a conductivity-imparting material. (Tables 1-1 and 1-2 shows the mixture composition). The resulting mixture was pulverized and mixed with a ball mill to form slurry. The slurry was spray-dried with a spray dryer to form granules. Then 20% by mass of an ethylene-vinyl acetate copolymer, polystyrene, and an acrylic resin, in total, with respect to 100% by mass of the granules were added to the granules. The resulting slurry was charged into a kneader and kneaded while being maintained at 150° C., forming a mixture. The resulting mixture was charged into a pelletizer to form pellets for use in injection molding. The resulting pellets were charged into a known injection molding machine to form formed articles to be formed into the vacuum suction nozzles 1 as shown in FIG. 1.

These formed articles were dried in a dryer filled with a nitrogen atmosphere and then sintered in an argon atmosphere at a maximum temperature of 1900° C. to 2200° C. for a holding time of 1 to 5 hours. The resulting sintered articles were subjected to barrel finishing, thereby removing the surface to a depth of several micrometers. Then a portion to be formed into the front surface 2 of each vacuum suction nozzle 1 was ground to form a plane, thereby affording the vacuum suction nozzle 1 including the cylindrical portion 5 having a length of 32 mm, an outer diameter of 0.7 mm, an inner diameter of 0.4 mm, and a thickness of 0.15 mm.

Samples 6 to 14 were prepared as follows.

Water was added to a raw-material mixture containing alumina, titanium carbide serving as a conductivity-imparting material, and a sintering agent (appropriately selected from magnesia, calcia, titania, zirconia, and the like) (Tables 1-1 and 1-2 shows the mixture composition). The resulting mixture was pulverized and mixed with a ball mill to form slurry. The slurry was spray-dried with a spray dryer to form granules. Then 20% by mass of an ethylene-vinyl acetate copolymer, polystyrene, and an acrylic resin, in total, with respect to about 100% by mass of the granules were added to the granules. The resulting slurry was charged into a kneader and kneaded while being maintained at 150° C., forming a mixture. The resulting mixture was charged into a pelletizer to form pellets for use in injection molding. The resulting pellets were charged into a known injection molding machine to form formed articles to be formed into the vacuum suction nozzles 1 as shown in FIG. 1.

These formed articles were dried in a dryer and then sintered in an argon atmosphere at a maximum temperature of 1400° C. to 1800° C. for a holding time of 1 to 5 hours. The resulting sintered articles were subjected to barrel finishing, thereby removing the surface to a depth of several micrometers. Then a portion to be formed into the front surface 2 of each vacuum suction nozzle 1 was ground to form a plane, thereby affording the vacuum suction nozzle 1 including the cylindrical portion 5 having a length of 32 mm, an outer diameter of 0.7 mm, an inner diameter of 0.4 mm, and a thickness of 0.15 mm.

Samples 15 to 22 were prepared as follows.

Water was added to a raw-material mixture containing zirconia containing μm 3% by mole yttria serving as a stabilizer, and iron oxide, cobalt oxide, chromium oxide, and nickel oxide serving as conductivity-imparting materials (Tables 1-1 and 1-2 shows the mixture composition). The resulting mixture was pulverized and mixed with a ball mill to form a slurry. The slurry was spray-dried with a spray dryer to form granules. Then 20% by mass of an ethylene-vinyl acetate copolymer, polystyrene, and an acrylic resin, in total, with respect to 100% by mass of the granules were added to the granules. The resulting slurry was charged into a kneader and kneaded while being maintained at 150° C., forming a mixture. The resulting mixture was charged into a pelletizer to form pellets for use in injection molding. The resulting pellets were charged into a known injection molding machine to form formed articles to be formed into the vacuum suction nozzles 1 as shown in FIG. 1.

These formed articles were dried in a dryer and then sintered in an air atmosphere at a maximum temperature of 1300° C. to 1500° C. for a holding time of 1 to 5 hours. The resulting sintered articles were subjected to barrel finishing, thereby removing the surface to a depth of several micrometers. Then a portion to be formed into the front surface 2 of each vacuum suction nozzle 1 was ground to form a plane, thereby affording the vacuum suction nozzle 1 including the cylindrical portion 5 having a length of 32 mm, an outer diameter of 0.7 mm, an inner diameter of 0.4 mm, and a thickness of 0.15 mm.

Evaluation test of samples 1 to 22 was performed as follows.

Resistance values of samples 1 to 22 of the vacuum suction nozzles 1 were measured. Tables 1-1 and 1-2 show the test results. The results demonstrated that samples 1 to 4, 7 to 12, and 16 to 21 were defined as the vacuum suction nozzles 1 of the present invention and that samples 5, 6, 13 to 15, and 22 were defined as the vacuum suction nozzles 1 outside the range of the present invention (that is, Comparative Examples).

TABLE 1-1

| Sample | Ceramic material | Resistance between front end and rear end (Ω) | Total of conductivity-imparting material | Conductivity-imparting material | | | | | | Sintering agent | Damage by electro-static discharge | Blowing off of object to be sucked | Color of vacuum suction nozzle |
| | | | | Iron oxide | Cobalt oxide | Chromium oxide | Nickel oxide | Titanium carbide | Carbon | | | | |
| | | | | % by mass | | | | | | | | | |
| 1 | Silicon carbide | 10⁶ | 0 | 0 | 0 | 0 | 0 | 0 | <0.1 | 5 | A | A | Black |
| 2 | Silicon carbide | 10⁵ | 0.2 | 0 | 0 | 0 | 0 | 0 | 0.2 | 5 | A | A | Black |
| 3 | Silicon carbide | 10⁴ | 1 | 0 | 0 | 0 | 0 | 0 | 1 | 5 | B | A | Black |
| 4 | Silicon carbide | 10³ | 3 | 0 | 0 | 0 | 0 | 0 | 3 | 5 | B | A | Black |
| 5 | Silicon carbide | 10² | 4 | 0 | 0 | 0 | 0 | 0 | 4 | 5 | C | A | Black |

TABLE 1-1-continued

| Sample | Ceramic material | Resistance between front end and rear end (Ω) | Total of conductivity-imparting material | Iron oxide | Cobalt oxide | Chromium oxide | Nickel oxide | Titanium carbide | Carbon | Sintering agent | Damage by electrostatic discharge | Blowing off of object to be sucked | Color of vacuum suction nozzle |
|---|---|---|---|---|---|---|---|---|---|---|---|---|---|
| | | | | | | % by mass | | | | | | | |
| 6 | Alumina | $10^{12}$ | 0 | 0 | 0 | 0 | 0 | 0 | 0 | 0.5 | B | C | White |
| 7 | Alumina | $10^{11}$ | 3 | 0 | 0 | 0 | 0 | 3 | 0 | 1 | B | B | Gray |
| 8 | Alumina | $10^{9}$ | 5 | 0 | 0 | 0 | 0 | 5 | 0 | 1 | A | B | Black |
| 9 | Alumina | $10^{8}$ | 8 | 0 | 0 | 0 | 0 | 8 | 0 | 2 | A | A | Black |
| 10 | Alumina | $10^{5}$ | 13 | 0 | 0 | 0 | 0 | 13 | 0 | 4 | A | A | Black |
| 11 | Alumina | $10^{4}$ | 15 | 0 | 0 | 0 | 0 | 15 | 0 | 4 | B | A | Black |
| 12 | Alumina | $10^{3}$ | 17 | 0 | 0 | 0 | 0 | 17 | 0 | 5 | B | A | Black |

TABLE 1-2

| Sample | Ceramic material | Resistance between front end and rear end (Ω) | Total of conductivity-imparting material | Iron oxide | Cobalt oxide | Chromium oxide | Nickel oxide | Titanium carbide | Carbon | Sintering agent | Damage by electrostatic discharge | Blowing off of object to be sucked | Color of vacuum suction nozzle |
|---|---|---|---|---|---|---|---|---|---|---|---|---|---|
| | | | | | | % by mass | | | | | | | |
| 13 | Alumina | $10^{2}$ | 19 | 0 | 0 | 0 | 0 | 19 | 0 | 5 | C | A | Black |
| 14 | Alumina | $10^{0-3}$ | 29 | 0 | 0 | 0 | 0 | 29 | 0 | 6 | C | A | Black |
| 15 | Zirconia | $10^{12}$ | 0 | 0 | 0 | 0 | 0 | 0 | 0 | 0 | B | C | White |
| 16 | Zirconia | $10^{11}$ | 28 | 23 | 2 | 2 | 1 | 0 | 0 | 0 | B | B | Black |
| 17 | Zirconia | $10^{9}$ | 32 | 27 | 2 | 2 | 1 | 0 | 0 | 0 | A | B | Black |
| 18 | Zirconia | $10^{8}$ | 34 | 29 | 2 | 2 | 1 | 0 | 0 | 0 | A | A | Black |
| 19 | Zirconia | $10^{7}$ | 36 | 31 | 2 | 2 | 1 | 0 | 0 | 0 | A | A | Black |
| 20 | Zirconia | $10^{5}$ | 41 | 36 | 2 | 2 | 1 | 0 | 0 | 0 | A | A | Black |
| 21 | Zirconia | $10^{3}$ | 45 | 40 | 2 | 2 | 1 | 0 | 0 | 0 | B | A | Black |
| 22 | Zirconia | $10^{2}$ | 50 | 45 | 2 | 2 | 1 | 0 | 0 | 0 | C | A | Black |

Each of samples 1 to 22 of the vacuum suction nozzles 1 was practically attached to the electronic component mounting device 14, and then a transport test of the electronic components 15 was performed (in order to check the occurrence of the blowing off of the electronic components 15 and to check the occurrence of damage to the electronic components 15 by electrostatic discharge). As the electronic components 15, 0603-type components (dimensions: 0.6 mm×0.3 mm) were used. The minimum mounting spacing between the electronic components 15 on a circuit board was set to 0.1 mm.

The occurrence of the blowing off of the electronic components 15 was checked as follows: Twenty million electronic components 15 were transported onto dummy boards. After completion of the transport, the number of the electronic components 15 on the dummy boards was counted to determine the number of the electronic components 15 blown off. Tables 1-1 and 1-2 show the test results. The symbols were defined as follows: A indicates that the number of the electronic components blown off was 3 or less; B indicates that the number of the electronic components blown off was 4 to 10, and C indicates that the number of the electronic components blown off was 11 or more. Notably, when the vacuum suction nozzle 31 of the related art was used, the number of the electronic components blown off was about 11.

Furthermore, the occurrence of damage to the electronic components 15 by electrostatic discharge was checked as follows: Twenty million electronic components 15 were transported and mounted onto dummy boards including circuits. After completion of the mounting, damage to the electronic components 15 by electrostatic discharge was checked by energizing the circuits of the dummy boards. In this test, 100 electronic components 15 were mounted on one dummy board. A continuity test was performed for each dummy board with a common circuit tester. The dummy boards through which a current did not flow were selected. The continuity test was performed for each electronic components 15 to count the number of the electronic components 15 damaged by electrostatic discharge. Tables 1-1 and 1-2 show the test results. The symbols were defined as follows. Symbol A indicates the number of the electronic components damaged by electrostatic discharge was 3 or less; Symbol B indicates the number of the electronic components damaged by electrostatic discharge was 4 to 10; and Symbol C indicates the number of the electronic components damaged by electrostatic discharge was 11 or more. Notably, when the vacuum suction nozzle 31 of the related art was used, the number of the electronic components damaged by electrostatic discharge was about 11.

The results shown in Tables 1-1 and 1-2 demonstrated that in both cases of studying the occurrence of the blowing off of the electronic components 15 and the occurrence of damage by electrostatic discharge, satisfactory results were obtained when the vacuum suction nozzles 1 had resistances of $10^3 \Omega$ to $10^{11} \Omega$ (samples 1 to 4, 7 to 12, and 16 to 21). In particular, when the vacuum suction nozzles 1 had resistances of $10^5 \Omega$ to $10^8 \Omega$ (samples 1, 2, 9, 10, and 18 to 20), the number of the electronic components 15 damaged by electrostatic discharge and the number of the electronic components 15 blown off were each 3 or less, which was very good result.

In contrast, when the vacuum suction nozzles 1 had resistances of less than $10^3 \Omega$ (samples 5, 13, 14, and 22), the results of the occurrence of damage by electrostatic discharge were poor. When vacuum suction nozzles 1 had resistances exceeding $10^{11}\Omega$ (samples 6 and 15), the results of the occurrence of the blowing off were poor.

These results demonstrated that the vacuum suction nozzle 1 having a resistance of $10^3\Omega$ to $10^{11}\Omega$ had the effect of suppressing the blowing off of the electronic components 15 and damage to the electronic components 15 by electrostatic discharge. In particular, it was found that when the vacuum suction nozzle 1 had a resistance of $10^5\Omega$ to $10^8\Omega$, the effect was high.

EXAMPLE 2

Samples 23 to 28 were prepared as follows.

The relationship between the dimension (diameter) of the front surface 2 of the vacuum suction nozzle 1 and the damage of the front surface 2 was studied. For a test, the vacuum suction nozzles 1 having the suction faces 2 with different diameters (samples 23 to 28) were produced. A production procedure was the same as in Example 1. The suction faces 2 were circular. Table 2 shows the diameter of the front surface 2 of each sample. Note that the composition of each vacuum suction nozzle 1 was the same as in sample 17 in Example 1 (see Tables 1-1 and 1-2).

TABLE 2

| Sample | Outer diameter of cylindrical portion (mm) | Damage to suction face |
| --- | --- | --- |
| 23 | 1.2 | D |
| 24 | 1 | C |
| 25 | 0.8 | C |
| 26 | 0.7 | B |
| 27 | 0.6 | A |
| 28 | 0.5 | A |

Evaluation test of samples 23 to 28 was performed as follows.

A damage test of the front surface 2 was performed using samples 23 to 28 of the vacuum suction nozzles 1. Each vacuum suction nozzle 1 was attached to the electronic component mounting device 14, and then 35-million 0603-type electronic components 15 (dimensions: 0.6 mm×0.3 mm) were transported. The front surface 2 of the vacuum suction nozzle 1 was observed for every 5-million electronic components 15 with an optical microscope (50× magnification) to determine the presence or absence of damage to the suction face 2. The minimum mounting spacing between the electronic components 15 on a circuit board was set to about 0.1 mm. Table 2 shows the test results. The symbols were defined as follows: Symbol A indicates the front surface 2 was not damaged on transporting even when 35 million electronic components were transported. Symbol B indicates damage to the front surface 2 occurred on transporting 25 to 30 million electronic components. Symbol C indicates damage to the front surface 2 occurred on transporting 20 to 25 million electronic components. D indicates damage to the front surface 2 occurred on transporting less than 20 million electronic components. Notably, when the vacuum suction nozzle 1 of the related art was used, damage to the front surface 2 occurred on transporting less than 20 million electronic components.

The results shown in Table 2 demonstrated that a diameter of the front surface 2 of 0.7 mm or less (samples 26 to 28) provided satisfactory results. In particular, at a diameter of the front surface 2 of 0.6 mm or less (samples 27 and 28), the front surface 2 was not damaged even when 35 million electronic components were transported.

In contrast, a diameter of the front surface 2 exceeding 0.7 mm (samples 23 to 25) did not provide satisfactory results. The results demonstrated that the vacuum suction nozzle 1 having the front surface 2 with a diameter of 0.7 mm or less was suited to transport the small electronic components 15, e.g., 0603-type, onto a circuit board.

EXAMPLE 3

The relationship between the color of the vacuum suction nozzle 1 and the accuracy of position measurement of each of the electronic components 15 was studied.

In a position measurement test, samples 17 (black), 10 (black), and 15 (white) of the vacuum suction nozzles 1 produced in Example 1 were used. The compositions of samples are shown in Tables 1-1 and 1-2. In this test, test chips of five colors, black, blue, red, yellow, and white, were used in place of the electronic components 15.

In a position measurement test, the electronic component mounting apparatus 20 shown in FIG. 2 was used. As explained above, the electronic component mounting apparatus 20 comprises the electronic component mounting device 14 coupled to the vacuum suction nozzle 1 and the measurement optical system for analyzing the position of each test chip. The measurement optical system comprises the lights 17, the CCD camera 18, and the image analysis device 19 coupled to the CCD camera 18. The lights 17 emit light to the test chip sucked by the vacuum suction nozzle 1. The test chip is photographed by the CCD camera 18. The resulting image is analyzed by the image analysis device 19. The electronic component mounting device 14 arranges the test chip at a predetermined position of a circuit board based of the analysis result.

In the position measurement test, first, the vacuum suction nozzle 1 for the test was attached to the electronic component mounting device 14 and sucked the test chip. The test chip was photographed with the CCD camera 18. Then it was determined, whether the CCD camera 18 can discriminate between the test chip and the vacuum suction nozzle 1 (recognizability) or not. Then it was determined whether the test chip can be arranged at the predetermined position of the circuit board or not.

When black samples 10 and 17 of the vacuum suction nozzles 1 were used, satisfactory discrimination was provided in all test chips of five colors. Furthermore, all test chips of five colors were assuredly arranged at the predetermined positions of the circuit board.

In contrast, when white sample 15 of the vacuum suction nozzle 1 was used, satisfactory discrimination was provided in the test chips of four colors other than white. For the white test chip, discrimination seems to be reduced because of a low contrast between the test chip and the vacuum suction nozzle 1. The test chips of four colors other than white were assuredly arranged at the predetermined positions of the circuit board.

EXAMPLE 4

Samples 29 to 31 were prepared as follows.

The relationship between a type of ceramic material forming the vacuum suction nozzle 1 and the damage to the front surfaces 2 was studied. For this test, the same samples 10 (alumina based), 20 (stabilized zirconia based), and 2 (silicon carbide based) in example 1 were reproduced and referred to as samples 29 to 31 (Table 3). The front faces 2 were circular. Each of the front faces 2 had an outer diameter of 0.7 mm.

TABLE 3

| Sample | Sample in Table 1 | Ceramic material | Damage to suction face |
|---|---|---|---|
| 29 | 10 | Alumina | B |
| 30 | 18 | Zirconia | A |
| 31 | 2 | Silicon carbide | B |

Evaluation Test of Samples 29 to 31 was performed as follows.

A damage test of the front surface 2 was performed using samples 29 to 31 of the vacuum suction nozzles 1. Each vacuum suction nozzle 1 was attached to the electronic component mounting device 14, and then 35 million 0603-type electronic components 15 (0.6 mm×0.3 mm) were transported. The front surface 2 of the vacuum suction nozzle 1 was observed for every 5-million electronic components 15 with an optical microscope (50× magnification) to determine the presence or absence of damage to the suction face 2. The minimum mounting spacing between the electronic components on a circuit board was set to 0.1 mm. Table 3 shows the test results. The symbols were defined as follows: A) the front surface 2 was not damaged on transporting even when the 35-million electronic components were transported, B) damage to the front surface 2 occurred on transporting 25 to 30-million electronic components, C) damage to the front surface 2 occurred on transporting 20 to 25-million electronic components, and D) damage to the front surface 2 occurred on transporting less than 20 million electronic components. Notably, when the vacuum suction nozzle 31 of the existing art was used, damage to the front surface 2 occurred on transporting less than 20 million electronic components.

The results shown in Table 3 demonstrated that in sample 30 (stabilized zirconia based), the front surface 2 was not damaged even when 35-million electronic components were transported. In contrast, in each of samples 29 (alumina based) and 31 (silicon carbide based), damage to the front surface 2 occurred on transporting 25 to 30-million electronic components. The results demonstrated that when the vacuum suction nozzle 1 was composed of a stabilizer-containing zirconia-based ceramic material, the vacuum suction nozzle 1 had good mechanical strength. The reason for this is partially due to zirconia having a higher toughness than alumina or silicon carbide.

EXAMPLE 5

Samples 32 to 66 were prepared as follows.

Evaluation was made on the size of a chip formed when the front surface 2 of the vacuum suction nozzle 1 was subjected to grinding. A smaller chip results in higher form accuracy of an end face 70 and thus is preferred.

For a test, the vacuum suction nozzles 1 having compositions shown in Tables 4-1 to 4-3 were produced. In the Tables 4-1 to 4-3, zirconia indicates zirconia comprising 3% by mole yttria serving as a stabilizer. A procedure of forming samples was the same as in example 1. The front faces 2 were circular. Each of the front faces 2 had an outer diameter of 0.7 mm.

TABLE 4-1

| Sample | Zirconia (% by mass) | Total amount of iron oxide, chromium oxide, and titanium oxide (% by mass) | Iron oxide content (%) | Chromium oxide content (%) | Titanium oxide content (%) | Resistance (Ω) | Chipping of end face |
|---|---|---|---|---|---|---|---|
| 32 | 95 | 5 | 100 | 0 | 0 | $\geq 10^{12}$ | A |
| 33 | 90 | 10 | 99.5 | 0.4 | 0.1 | $\geq 10^{12}$ | A |
| 34 | 85 | 15 | 99.5 | 0.4 | 0.1 | $\geq 10^{12}$ | A |
| 35 | 80 | 20 | 100 | 0 | 0 | $10^{10}$ | B |
| 36 | 80 | 20 | 99.6 | 0.4 | 0 | $10^{10}$ | B |
| 37 | 80 | 20 | 99.5 | 0.5 | 0 | $10^{10}$ | B |
| 38 | 80 | 20 | 99.5 | 0.3 | 0.2 | $10^{10}$ | B |
| 39 | 80 | 20 | 99.5 | 0.4 | 0.1 | $10^{10}$ | A |
| 40 | 80 | 20 | 90 | 9 | 1 | $10^{10}$ | A |
| 41 | 80 | 20 | 80 | 15 | 5 | $10^{11}$ | A |
| 42 | 80 | 20 | 70 | 20 | 10 | $10^{11}$ | A |
| 43 | 80 | 20 | 70 | 25 | 5 | $10^{11}$ | B |
| 44 | 80 | 20 | 70 | 15 | 15 | $10^{11}$ | B |
| 45 | 80 | 20 | 65 | 20 | 15 | $\geq 10^{12}$ | B |

TABLE 4-2

| Sample | Zirconia (% by mass) | Total amount of iron oxide, chromium oxide, and titanium oxide (% by mass) | Iron oxide content (%) | Chromium oxide content (%) | Titanium oxide content (%) | Resistance (Ω) | Chipping of end face |
|---|---|---|---|---|---|---|---|
| 46 | 70 | 30 | 99.6 | 0.4 | 0 | $10^{6}$ | B |
| 47 | 70 | 30 | 99.5 | 0.5 | 0 | $10^{6}$ | B |
| 48 | 70 | 30 | 99.5 | 0.3 | 0.2 | $10^{6}$ | B |
| 49 | 70 | 30 | 99.5 | 0.4 | 0.1 | $10^{6}$ | A |
| 50 | 70 | 30 | 90 | 9 | 1 | $10^{6}$ | A |
| 51 | 70 | 30 | 80 | 15 | 5 | $10^{7}$ | A |
| 52 | 70 | 30 | 70 | 20 | 10 | $10^{7}$ | A |
| 53 | 70 | 30 | 70 | 25 | 5 | $10^{7}$ | B |
| 54 | 70 | 30 | 70 | 15 | 15 | $10^{7}$ | B |
| 55 | 65 | 35 | 99.6 | 0.4 | 0 | $10^{6}$ | B |
| 56 | 65 | 35 | 99.5 | 0.5 | 0 | $10^{6}$ | B |
| 57 | 65 | 35 | 99.5 | 0.3 | 0.2 | $10^{6}$ | B |
| 58 | 65 | 35 | 99.5 | 0.4 | 0.1 | $10^{6}$ | A |

TABLE 4-2-continued

| Sample | Zirconia (% by mass) | Total amount of iron oxide, chromium oxide, and titanium oxide (% by mass) | Iron oxide content (%) | Chromium oxide content (%) | Titanium oxide content (%) | Resistance (Ω) | Chipping of end face |
|---|---|---|---|---|---|---|---|
| 59 | 65 | 35 | 90 | 9 | 1 | $10^6$ | A |
| 60 | 65 | 35 | 80 | 15 | 5 | $10^7$ | A |

TABLE 4-3

| Sample | Zirconia (% by mass) | Total amount of iron oxide, chromium oxide, and titanium oxide (% by mass) | Iron oxide content (%) | Chromium oxide content (%) | Titanium oxide content (%) | Resistance (Ω) | Chipping of end face |
|---|---|---|---|---|---|---|---|
| 61 | 65 | 35 | 70 | 20 | 10 | $10^7$ | A |
| 62 | 65 | 35 | 70 | 25 | 5 | $10^7$ | B |
| 63 | 65 | 35 | 70 | 15 | 15 | $10^7$ | B |
| 64 | 60 | 40 | 90 | 9 | 1 | $10^4$ | B |
| 65 | 60 | 40 | 90 | 9 | 1 | $10^4$ | B |
| 66 | 60 | 40 | 80 | 15 | 5 | $10^5$ | B |
| 2 | Silicon carbide | 0.2 | — | — | — | $10^5$ | B |
| 10 | Alumina | 13 | — | — | — | $10^5$ | B |
| 20 | 59 | 41 | 88 | 5 | 0 | $10^5$ | B |

Evaluation test of samples 32 to 66 was performed as follows.

Figure 4:
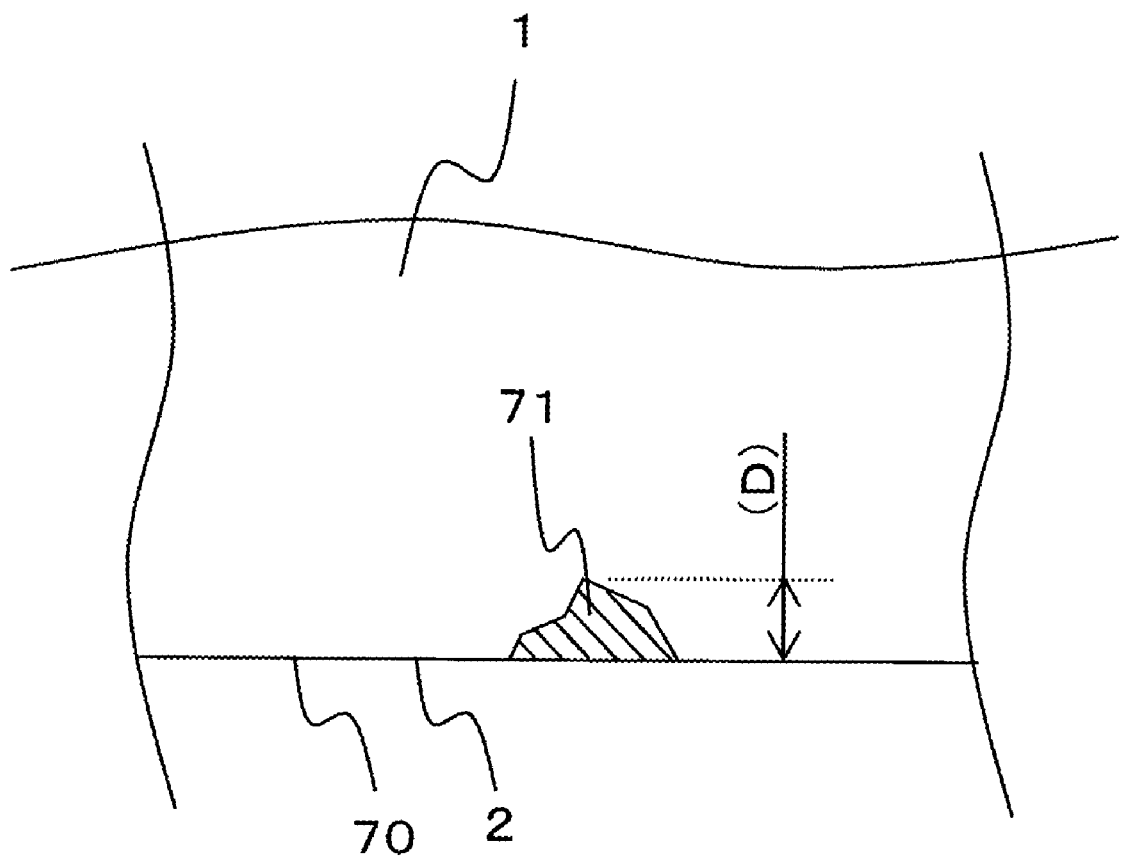
FIG. 4 is an illustration of schematic view showing an occurrence of chipping on a suction face of the vacuum suction nozzle in a grinding process.

A #325 electrodeposited grinding wheel was used for grinding of the suction face 2. A method for evaluating a chip is described with reference to FIG. 4. The end face 70 of the front surface 2 of the vacuum suction nozzle 1 was observed with a factory microscope at a magnification of 100× to determine the depth D (FIG. 4) of a chip 71 (hatched portion). Tables 4-1 to 4-3 show the test results. The symbols were defined as follows: Symbol A indicates the substantially maximum value of the depth D (FIG. 4) was 30 μm or less, Symbol B indicates the substantially maximum value of the depth D was more than 30 μm and 50 μm or less, and Symbol C indicates the substantially maximum value of the depth D was more than 50 μm.

The results shown in Tables 4-1 to 4-3 demonstrated that samples 39 to 42, 49 to 52, and 58 to 61 were the best samples because the depth D of the chip was 30 μm or less. Each of the samples comprised 65% to 80% by mass of zirconia and 20% to 35% by mass of the conductivity-imparting material (iron oxide, chromium oxide, and titanium oxide). Furthermore, each of the conductivity-imparting materials had an iron oxide content of 70% to 99.5%, a chromium oxide content of 0.4% to 20%, and titanium oxide content of 0.1% to 10%. In general, an increased depth of the chip 71 seems to be attributed to the grain growth of zirconia and iron oxide. Each of the samples had appropriate proportions of the constituents, thus probably suppressing the grain growth of zirconia and iron oxide.

Each of samples 35 to 38, 43, 44, 46 to 48, 53 to 57, 62 to 66, 2, 10, and 20 had a depth D of 30 μm to 50 μm, which was a satisfactory result. Each of samples 32 to 34 had a depth D of the chip of 30 μm or less, which was a good result. Furthermore, sample 45 had a depth D of the chip of 50 μm or less, which was a satisfactory result. However, in these samples, each of the vacuum suction nozzles 1 had a resistance of $10^{12} Ω$ or more, which may cause a problem of charging.

EXAMPLE 6

In the case where high-speed mounting was performed, the blowing off of the electronic components 15 and damage to the electronic components 15 by electrostatic discharge were studied. For a test, samples 1 to 4, 7 to 11, and 17 to 20 of the vacuum suction nozzles 1 produced in Example 1 were used.

The mounting speed was defined as the number of the electronic components 15 transported per hour (chip per hour, hereinafter referred to as "CPH"). In this experiment, the mounting speed was set at 4500 CPH (attachment-detachment cycle: 0.8 seconds), 7200 CPH (attachment-detachment cycle: 0.5 seconds), 12,000 CPH (attachment-detachment cycle: 0.3 seconds), 18,000 CPH (attachment-detachment cycle: 0.2 seconds), or 20,000 CPH (attachment-detachment cycle: 0.18 seconds).

The occurrence of the blowing off of the electronic components 15 was checked as follows: Twenty million electronic components 15 were transported onto dummy boards. After completion of the transport, the number of the electronic components 15 on the dummy boards was counted to determine the number of the electronic components 15 blown off. Tables 5-1 to 5-3 show the test results. The symbols were defined as follows: Symbol A indicates the number of the electronic components blown off was 3 or less; Symbol B: indicates the number of the electronic components blown off was 4 to 10; and Symbol C indicates the number of the electronic components blown off was 11 or more.

TABEL 5-1

| Sample | Ceramic material | Resistance between front end and rear end (Ω) | Mounting speed (CPH) | Damage by electrostatic discharge | Blowing off of object to be sucked |
|---|---|---|---|---|---|
| 1 | Silicon carbide | 106 | 20000 | A | A |
|   |   |   | 18000 | A | A |
|   |   |   | 12000 | A | A |
|   |   |   | 7200 | A | A |
|   |   |   | 4500 | A | A |
| 2 | Silicon carbide | 105 | 20000 | A | A |
|   |   |   | 18000 | A | A |
|   |   |   | 12000 | A | A |
|   |   |   | 7200 | A | A |
|   |   |   | 4500 | A | A |

TABEL 5-1-continued

| Sample | Ceramic material | Resistance between front end and rear end (Ω) | Mounting speed (CPH) | Damage by electrostatic discharge | Blowing off of object to be sucked |
|---|---|---|---|---|---|
| 3 | Silicon carbide | $10^4$ | 20000 | B | A |
| | | | 18000 | B | A |
| | | | 12000 | B | A |
| | | | 7200 | A | A |
| | | | 4500 | A | A |
| 4 | Silicon carbide | $10^3$ | 20000 | B | A |
| | | | 18000 | B | A |
| | | | 12000 | B | A |
| | | | 7200 | B | A |
| | | | 4500 | A | A |
| 7 | Alumina | $10^{11}$ | 20000 | A | B |
| | | | 18000 | A | B |
| | | | 12000 | A | B |
| | | | 7200 | A | A |
| | | | 4500 | A | A |

TABEL 5-2

| Sample | Ceramic material | Resistance between front end and rear end (Ω) | Mounting speed (CPH) | Damage by electrostatic discharge | Blowing off of object to be sucked |
|---|---|---|---|---|---|
| 8 | Alumina | $10^9$ | 20000 | A | B |
| | | | 18000 | A | B |
| | | | 12000 | A | A |
| | | | 7200 | A | A |
| | | | 4500 | A | A |
| 9 | Alumina | $10^8$ | 20000 | A | A |
| | | | 18000 | A | A |
| | | | 12000 | A | A |
| | | | 7200 | A | A |
| | | | 4500 | A | A |
| 10 | Alumina | $10^5$ | 20000 | A | A |
| | | | 18000 | A | A |
| | | | 12000 | A | A |
| | | | 7200 | A | A |
| | | | 4500 | A | A |
| 11 | Alumina | $10^4$ | 20000 | B | A |
| | | | 18000 | B | A |
| | | | 12000 | B | A |
| | | | 7200 | A | A |
| | | | 4500 | A | A |
| 17 | Zirconia | $10^9$ | 20000 | A | B |
| | | | 18000 | A | B |
| | | | 12000 | A | A |
| | | | 7200 | A | A |
| | | | 4500 | A | A |

TABEL 5-3

| Sample | Ceramic material | Resistance between front end and rear end (Ω) | Mounting speed (CPH) | Damage by electrostatic discharge | Blowing off of object to be sucked |
|---|---|---|---|---|---|
| 18 | Zirconia | $10^8$ | 20000 | A | A |
| | | | 18000 | A | A |
| | | | 12000 | A | A |
| | | | 7200 | A | A |
| | | | 4500 | A | A |
| 19 | Zirconia | $10^7$ | 20000 | A | A |
| | | | 18000 | A | A |
| | | | 12000 | A | A |
| | | | 7200 | A | A |
| | | | 4500 | A | A |
| 20 | Zirconia | $10^5$ | 20000 | A | A |
| | | | 18000 | A | A |
| | | | 12000 | A | A |
| | | | 7200 | A | A |
| | | | 4500 | A | A |

Furthermore, the occurrence of damage to the electronic components 15 by electrostatic discharge was checked as follows: Twenty million electronic components 15 were transported and mounted onto dummy boards comprising circuits. After completion of the mounting, damage to the electronic components 15 by electrostatic discharge was checked by energizing the circuits of the dummy boards. A method for measuring damage by electrostatic discharge was the same as in the example 1. Tables 5-1 to 5-3 show the test results. The symbols were defined as follows: Symbol A indicates the number of the electronic components damaged by electrostatic discharge was 3 or less, Symbol B indicates the number of the electronic components damaged by electrostatic discharge was 4 to 10, and Symbol C indicates the number of the electronic components damaged by electrostatic discharge was 11 or more.

The results shown in Tables 5-1 to 5-3 demonstrated that in each of the studies of the occurrence of the blowing off of the electronic components 15 and the occurrence of damage to the electronic components 15 by electrostatic discharge, a resistance of the vacuum suction nozzle 1 of $10^3$ to $10^{11}$ Ω (samples 1 to 4, 7 to 11, and 17 to 20) provided relatively good results. In particular, when the vacuum suction nozzle 1 had a resistance of $10^5$ to $10^8$ Ω (samples 1, 2, 9, 10, and 18 to 20), very good results were obtained in all mounting speeds. These results demonstrated that the vacuum suction nozzle 1 having a resistance of $10^5$ to $10^8$ Ω made it possible to correspond to a higher mounting speed.

Samples 3 and 11 provided good results for the blowing off of the object to be sucked in all mounting speeds. With respect to damage by electrostatic discharge, however, in these samples, the number of the electronic components damaged tends to increase at a mounting speed of 12,000 CPH or more. The reason for this may be due to samples having a relatively low resistance of $10^4$ Ω. Thus, at a higher mounting speed, discharge occurs readily from an electrostatically charged member around the vacuum suction nozzle 1 to the front end of the vacuum suction nozzle 1 and the sucked electronic component 15.

Furthermore, samples 8 and 17 provided good results for damage by electrostatic discharge in the mounting speeds tested. With respect to the blowing off of the object to be sucked, however, in these samples, the number of the electronic components tends to increase at a mounting speed of 18,000 CPH or more. The reason for this may be due to the samples having a relatively high resistance of $10^9$ Ω. Thus, static electricity is not sufficiently removed at a higher mounting speed, thereby increasing the electrostatic repulsion acting between the vacuum suction nozzle 1 and the electronic components 15.

The above-described examples demonstrated that the vacuum suction nozzle 1 of the present invention was not readily charged and thus was not susceptible to static electricity when it was fixed to the electronic component mounting apparatus 20 and then transported the electronic components 15; hence, the vacuum suction nozzle 1 had the effect of suppressing the blowing off of the electronic components 15 by the electrostatic repulsion acting between the vacuum suction nozzle 1 and the electronic components 15. Furthermore, the results demonstrated that the vacuum suction nozzle 1 had the effect of suppressing damage to the electronic components 15 by electrostatic discharge.

Moreover, the results demonstrated that the vacuum suction nozzle 1 comprising the zirconia ceramic material comprising the stabilizer suppressed damage to the suction face 2.

In addition, the results demonstrated that appropriate selection of the color of the vacuum suction nozzle 1 resulted in the accurate mounting of the electronic components 15 on predetermined positions of circuit boards.

EXAMPLE 7

A raw-material mixture containing a ceramic material, conductivity-imparting materials are prepared. The ceramic material is selected from alumina, zirconia containing 3% by mole yttria serving as a stabilizer, and silicon nitride. The conductivity-imparting materials are iron oxide, cobalt oxide, chromium oxide, and nickel oxide. The composition of each example is shown in Table 7. As shown in Table 7, the samples Nos. 69, and 77 to 106 contain one or more conductivity-imparting materials, while the samples 67, 68, 70 to 76 and 107 to 112 does not contain conductivity-imparting materials. Water was added to the raw-material mixtures. Each of the resulting mixtures was pulverized and mixed using a ball mill to form slurry. Each of the resulting slurries was spray-dried with a spray dryer to form granules.

Then 20% by mass of an ethylene-vinyl acetate copolymer, polystyrene, and an acrylic resin, in total, with respect to 100% by mass of the granules were added to the granules. The resulting slurry was charged into a kneader and kneaded while being maintained at about 150° C., thereby forming a mixture. The resulting mixture was charged into a pelletizer to form pellets for use in injection molding. The resulting pellets were charged into a known injection molding machine to form articles to be formed into the vacuum suction nozzles 1 as shown in FIG. 1. Then these formed articles were dried in a dryer.

The dried articles not containing the conductivity-imparting material were fired by a common method for firing a ceramic material, thereby forming sintered articles. A portion of each sintered article to be formed into the suction face 2 of a corresponding one of the vacuum suction nozzles 1 was ground to form a plane. The cylindrical portion 5 of the vacuum suction nozzle 1 was processed so as to have a length of 3.2 mm, an outer diameter of 1.2 mm, an inner diameter of 0.8 mm, and a thickness of 0.2 mm.

For samples 68, 70 to 75, and 112, carbon serving as a conductivity-imparting material was deposited on the processed articles by a physical deposition method to form the vacuum suction nozzles 1 each covered with the layer 7 composed of the conductivity-imparting material. In this case, each conductive layer 7 comprising the conductivity-imparting material had a thickness of 0.1 μm to 22 μm.

Similarly, for samples 107 to 110, layers 7 comprising the zirconia comprising iron oxide were formed so as to cover sample 76 by a physical deposition method, thereby affording the vacuum suction nozzles 1. In this case, each conductive layer 7 had a thickness of 0.1 to 10 μm.

On the other hand, the formed articles comprising the conductivity-imparting materials (i.e., samples 69, 79 to 91, 93 to 98, and 101 to 106) were placed in firing furnaces used for firing those ceramic materials. The formed articles were heated to a first temperature and maintained for 1 to 3 hours at the first temperature, followed by heating to the second temperature, and maintaining for 2 hours at the second temperature. As a result, each conductive layer 7 comprising ceramic materials comprising conductivity-imparting materials was precipitated. In this case, the second temperature is higher than the first temperature by 50° C. to 100° C. The second temperature can be the substantially maximum temperature in the process.

A portion of each sintered article to be formed into the front surface 2 of a corresponding one of the vacuum suction nozzles 1 was ground to form a plane. In this case, each of the layers 7 has a thickness of 0.1 μm to 29 μm.

Vacuum suction nozzles for samples 67, 76 to 78, 92, 99, 100, and 111 have neither a conductive layer 7 which comprises a ceramic material containing a conductivity-imparting material nor a conductive layer 7 comprising a conductivity-imparting material, but were produced by the similar method as mentioned above. That is, articles formed from raw-material mixtures that do not contain a conductivity-imparting material and articles formed from raw-material mixtures that contain small amounts of conductivity-imparting materials were produced. These articles were fired by a common method for firing a ceramic material, thereby forming sintered articles. A portion of each sintered article to be formed into the suction face of a corresponding one of the vacuum suction nozzles was ground to form a plane. Thereby, the vacuum suction nozzles that do not include a conductive layer 7 comprising a ceramic material comprising a conductivity-imparting material or a conductive layer 7 composed of a conductivity-imparting material were produced.

The blowing off of the electronic components 15 was checked as follows. Twenty million electronic components 15 were sucked by the electronic component mounting device 14 and mounted on dummy boards. The number of the electronic components 15 on the dummy boards was counted to determine the number of the electronic components 15 blown off. Symbol A was used to indicate that the number of the electronic components blown off was 3 or less. Symbol B indicated the number of the electronic components blown off was 4 to 10. Symbol C indicated the number of the electronic components blown off was 11 to 29, which is a value equivalent to that in the existing art. Symbol D indicated the number of the electronic components blown off was 30 or more, in which the value was inferior to that in the existing art and the vacuum suction nozzle was rejected.

Furthermore, damage to the electronic components 15 by electrostatic discharge was checked as follows. Twenty million electronic components 15 were sucked by the electronic component mounting device 14 and mounted on dummy boards including circuits. An energization test for the dummy boards was performed to determine whether the circuit boards on which the electronic components 15 were mounted were energized or not. Thereby, the presence or absence of damage to the electronic components 15 by electrostatic discharge was determined. In this test, 100 electronic components 15 were mounted on one dummy board. A continuity test was performed for each dummy board with a commonly used circuit tester. Only problematic dummy boards were selected. The continuity test was further performed for each electronic component 15 to determine whether the component was operable or not. Then the number of the electronic components 15 damaged by electrostatic discharge was counted. Symbol A was used to indicate that the number of the electronic components damaged by electrostatic discharge was 3 or less. Symbol B was used to indicate that the number of the electronic components damaged by electrostatic discharge was 4 to 10. Symbol C was used to indicate that the number of the electronic components damaged by electrostatic discharge was 11 to 19, in which the value was equivalent to that in the related art. Symbol D was used to indicate that the number of the electronic components damaged by electrostatic discharge was 20 or more, in which the value was inferior to that in the related art and the vacuum suction nozzle was rejected. Table 6-1 and 6-2 show the results.

TABLE 6-1

| Sample | Ceramic material | Presence or absence of layer | Presence or absence of precipitate layer | Total amount added | Iron oxide | Cobalt oxide | Chromium oxide | Nickel oxide | Zinc oxide | Titanium oxide | Others | Presence or absence of carbon layer | Presence or absence of ceramic layer containing conductivity-imparting material | Thickness of layer (μm) | Blowing off of object to be sucked | Damage to sucked object by electrostatic discharge |
|---|---|---|---|---|---|---|---|---|---|---|---|---|---|---|---|---|
| | | | | | | | % by mass | | | | | | | | | |
| 67 | Alumina | Absent | Absent | 0 | 0 | 0 | 0 | 0 | 0 | 0 | 0 | Absent | Absent | 0 | D | D |
| 68 | Alumina | Present | Absent | 0 | 0 | 0 | 0 | 0 | 0 | 0 | 0 | Present | Absent | 2 | A | A |
| 69 | Alumina | Present | Present | 30 | 25 | 1 | 1 | 3 | 0 | 0 | 0 | Absent | Absent | 1.3 | A | A |
| 70 | Zirconia | Present | Absent | 0 | 0 | 0 | 0 | 0 | 0 | 0 | 0 | Present | Absent | 0.1 | B | B |
| 71 | Zirconia | Present | Absent | 0 | 0 | 0 | 0 | 0 | 0 | 0 | 0 | Present | Absent | 0.5 | A | A |
| 72 | Zirconia | Present | Absent | 0 | 0 | 0 | 0 | 0 | 0 | 0 | 0 | Present | Absent | 2.2 | A | A |
| 73 | Zirconia | Present | Absent | 0 | 0 | 0 | 0 | 0 | 0 | 0 | 0 | Present | Absent | 10 | A | A |
| 74 | Zirconia | Present | Absent | 0 | 0 | 0 | 0 | 0 | 0 | 0 | 0 | Present | Absent | 20 | A | A |
| 75 | Zirconia | Present | Absent | 0 | 0 | 0 | 0 | 0 | 0 | 0 | 0 | Present | Absent | 22 | A | A |
| 76 | Zirconia | Absent | Absent | 0 | 0 | 0 | 0 | 0 | 0 | 0 | 0 | Absent | Absent | 0 | D | D |
| 77 | Zirconia | Absent | Absent | 3 | 3 | 0 | 0 | 0 | 0 | 0 | 0 | Absent | Absent | 0 | C | C |
| 78 | Zirconia | Absent | Absent | 9 | 7 | 2 | 0 | 0 | 0 | 0 | 0 | Absent | Absent | 0 | C | C |
| 79 | Zirconia | Present | Present | 10 | 10 | 0 | 0 | 0 | 0 | 0 | 0 | Absent | Absent | 0.1 | B | B |
| 80 | Zirconia | Present | Present | 15 | 10 | 2 | 2 | 1 | 0 | 0 | 0 | Absent | Absent | 0.2 | B | B |
| 81 | Zirconia | Present | Present | 20 | 15 | 2 | 2 | 1 | 0 | 0 | 0 | Absent | Absent | 0.5 | A | A |
| 82 | Zirconia | Present | Present | 30 | 25 | 2 | 2 | 1 | 0 | 0 | 0 | Absent | Absent | 1.1 | A | A |
| 83 | Zirconia | Present | Present | 35 | 30 | 2 | 2 | 1 | 0 | 0 | 0 | Absent | Absent | 1.5 | A | A |
| 84 | Zirconia | Present | Present | 40 | 30 | 4 | 4 | 2 | 0 | 0 | 0 | Absent | Absent | 1.7 | A | A |
| 85 | Zirconia | Present | Present | 45 | 35 | 4 | 4 | 2 | 0 | 0 | 0 | Absent | Absent | 3 | A | A |
| 86 | Zirconia | Present | Present | 50 | 35 | 5 | 5 | 5 | 0 | 0 | 0 | Absent | Absent | 3 | A | A |
| 87 | Zirconia | Present | Present | 35 | 30 | 2 | 2 | 1 | 0 | 0 | 0 | Absent | Absent | 12 | A | A |
| 88 | Zirconia | Present | Present | 35 | 30 | 2 | 2 | 1 | 0 | 0 | 0 | Absent | Absent | 17 | A | A |
| 89 | Zirconia | Present | Present | 35 | 30 | 2 | 2 | 1 | 0 | 0 | 0 | Absent | Absent | 20 | A | A |

TABLE 6-2

| Sample | Ceramic material | Presence or absence of layer | Presence or absence of precipitate layer | Total amount added | Iron oxide | Cobalt oxide | Chromium oxide | Nickel oxide | Zinc oxide | Titanium oxide | Others |
|---|---|---|---|---|---|---|---|---|---|---|---|
| | | | | | | | % by mass | | | | |
| 90 | Zirconia | Present | Present | 35 | 30 | 2 | 2 | 1 | 0 | 0 | 0 |
| 91 | Zirconia | Present | Present | 35 | 30 | 2 | 2 | 1 | 0 | 0 | 0 |
| 92 | Zirconia | Absent | Absent | 5 | 0 | 0 | 0 | 0 | 5 | 0 | 0 |
| 93 | Zirconia | Present | Present | 10 | 0 | 0 | 0 | 0 | 10 | 0 | 0 |
| 94 | Zirconia | Present | Present | 20 | 0 | 0 | 0 | 0 | 20 | 0 | 0 |
| 95 | Zirconia | Present | Present | 35 | 0 | 0 | 0 | 0 | 35 | 0 | 0 |
| 96 | Zirconia | Present | Present | 40 | 0 | 0 | 0 | 0 | 40 | 0 | 0 |
| 97 | Zirconia | Present | Present | 45 | 0 | 0 | 0 | 0 | 45 | 0 | 0 |
| 98 | Zirconia | Present | Present | 50 | 0 | 0 | 0 | 0 | 50 | 0 | 0 |
| 99 | Zirconia | Absent | Absent | 2 | 0 | 0 | 0 | 0 | 0 | 2 | 0 |
| 100 | Zirconia | Absent | Absent | 5 | 0 | 0 | 0 | 0 | 0 | 5 | 0 |
| 101 | Zirconia | Present | Present | 10 | 0 | 0 | 0 | 0 | 0 | 10 | 0 |
| 102 | Zirconia | Present | Present | 15 | 0 | 0 | 0 | 0 | 0 | 15 | 0 |
| 103 | Zirconia | Present | Present | 20 | 0 | 0 | 0 | 0 | 0 | 20 | 0 |
| 104 | Zirconia | Present | Present | 25 | 0 | 0 | 0 | 0 | 0 | 25 | 0 |
| 105 | Zirconia | Present | Present | 30 | 0 | 0 | 0 | 0 | 0 | 30 | 0 |
| 106 | Zirconia | Present | Present | 45 | 0 | 0 | 0 | 0 | 0 | 45 | 0 |
| 107 | Zirconia | Present | Absent | 0 | 0 | 0 | 0 | 0 | 0 | 0 | 0 |
| 108 | Zirconia | Present | Absent | 0 | 0 | 0 | 0 | 0 | 0 | 0 | 0 |
| 109 | Zirconia | Present | Absent | 0 | 0 | 0 | 0 | 0 | 0 | 0 | 0 |
| 110 | Zirconia | Present | Absent | 0 | 0 | 0 | 0 | 0 | 0 | 0 | 0 |
| 111 | Silicon nitride | Absent | Absent | 0 | 0 | 0 | 0 | 0 | 0 | 0 | 0 |
| 112 | Silicon nitride | Present | Absent | 0 | 0 | 0 | 0 | 0 | 0 | 0 | 0 |

| Sample | Presence or absence of carbon layer | Coating layer: Presence or absence of ceramic layer containing conductivity-imparting material | Thickness of layer (μm) | Blowing off of object to be sucked | Damage to sucked object by electrostatic discharge |
|---|---|---|---|---|---|
| 90 | Absent | Absent | 23 | A | A |
| 91 | Absent | Absent | 29 | A | A |
| 92 | Absent | Absent | 0 | C | C |
| 93 | Absent | Absent | 0.3 | B | B |
| 94 | Absent | Absent | 0.5 | A | A |
| 95 | Absent | Absent | 1.2 | A | A |
| 96 | Absent | Absent | 2.6 | A | A |
| 97 | Absent | Absent | 3.1 | A | A |
| 98 | Absent | Absent | 4.1 | A | A |
| 99 | Absent | Absent | 0 | D | D |
| 100 | Absent | Absent | 0 | C | C |
| 101 | Absent | Absent | 0.1 | B | B |
| 102 | Absent | Absent | 0.5 | A | A |
| 103 | Absent | Absent | 1.2 | A | A |
| 104 | Absent | Absent | 1.9 | A | A |
| 105 | Absent | Absent | 2.2 | A | A |
| 106 | Absent | Absent | 3.2 | A | A |
| 107 | Absent | Present | 0.1 | B | B |
| 108 | Absent | Present | 0.5 | A | A |
| 109 | Absent | Present | 5 | A | A |
| 110 | Absent | Present | 10 | A | A |
| 111 | Absent | Absent | 0 | D | D |
| 112 | Present | Absent | 1.9 | A | A |

The results shown in Table 6-1 and 6-2 demonstrated that with respect to the blowing off of the electronic components 15 and damage to the electronic components 15 by electrostatic discharge, in samples 68 to 75, 79 to 91, 93 to 98, 101 to 110, and 112 which were samples of the vacuum suction nozzles produced in this example of the present invention, the number of the blowing off of the electronic components 15 was within 10 of 20 million electronic components and that these samples were improved compared with samples 67, 76 to 78, 92, 99, 100, and 111 which were produced in a comparative example. That is, in this example of the present invention, the layers 7 comprising the ceramic materials comprising the conductivity-imparting materials or the layers 7 comprising the conductivity-imparting materials were formed on the side faces of the vacuum suction nozzles 1. Thus, when static electricity was generated on the vacuum suction nozzles 1, the static electricity were removed; hence, the blowing off of the electronic components 15 due to electrostatic repulsion occurred negligibly, and substantially no damage to the electronic components 15 were caused due to the by electrostatic discharge.

Next, each of samples of the vacuum suction nozzles was attached to the electronic component mounting device 14, and then a vacuum suction test of the electronic components 15 was performed to check the blowing off of the electronic components 15 and damage to the electronic components 15 by electrostatic discharge.

In samples 68, 69, 71 to 75, 81 to 91, 94 to 98, 102 to 110, and 112, the number of the blowing off of the electronic components 15 and the number of the electronic components 15 damaged by electrostatic discharge were 3 or less of 20 million electronic components. This is because static electricity was appropriately removed because the layers 7 comprising the ceramic materials comprising the conductivity-imparting materials or the layers 7 comprising the conductivity-imparting materials each had a thickness of 0.5 μm or more. Furthermore, it was found that the total amount of the conductivity-imparting materials added to the corresponding base ceramic material was preferably 10% by mass or more in order to precipitate out the layers 7 comprising the ceramic materials comprising the conductivity-imparting materials.

In contrast, among samples 67, 76 to 78, 92, 99, 100, and 111 which were produced in the comparative example of the present invention, in samples 67, 76, and 111 which were the vacuum suction nozzles comprising the ceramic materials or samples 77, 78, 92, 99, and 100 which comprising small amounts of the conductivity-imparting materials, when static electricity was generated, the static electricity was not readily removed because both of the layers 7 comprising a ceramic material comprising a conductivity-imparting material and a conductive layer 7 comprising a conductivity-imparting material were not formed. Thus, the number of the blowing off of the electronic components 15 and the number of the electronic components 15 damaged by electrostatic discharge were increased or were comparable to those in the related art.

In the example 7, alumina, zirconia, and silicon nitride were used as ceramic materials. The results demonstrated that in any case, the formation of the conductive layer 7 comprising the ceramic material comprising the conductivity-imparting materials or the conductive layer 7 comprising the conductivity-imparting materials on the side face of the vacuum suction nozzle 1 resulted in significant suppression of the occurrence of the problem of the blowing off of the electronic components 15 due to electrostatic repulsion.

EXAMPLE 8

To check the strength of the front surfaces 2 and the detachment of the layers 7 comprising the ceramic materials comprising the conductivity-imparting materials or the layers 7 comprising the conductivity-imparting materials, the occurrence of wear of the front faces 2 and the chipping of edges of the front faces 2 were investigated by producing the same samples 68 to 75, 79 to 91, 93 to 98, 101 to 106, and 112 of the vacuum suction nozzles 1 as those used in the example 1 and attaching samples to the electronic component mounting device 14. These samples were defined as samples 113 to 146 in this example of the present invention.

With respect to the detachment of the layers 7 comprising the ceramic materials comprising the conductivity-imparting materials or the layers 7 comprising the conductivity-imparting materials, the presence or absence of the detachment of the layers 7 comprising of the ceramic materials containing the conductivity-imparting materials or the layers 7 comprising the conductivity-imparting materials was determined as follows. Twenty million electronic components 15 were sucked by the electronic component mounting device 14. Then the vacuum suction nozzle 1 was detached from the electronic component mounting device 14. The each of the layers 7 was observed with a scanning electron microscope. Symbol A was used to indicate that no detachment of the layers 7 composed of the ceramic materials containing the conductivity-imparting materials or the layers 7 composed of the conductivity-imparting materials was observed. Symbol B was used to indicate that detachment was observed to some extent but that the vacuum suction nozzle was practically operable. Symbol C was used to indicate that the vacuum suction nozzle was practically inoperable because of a considerable degree of detachment and was thus rejected.

With respect to the determination of the presence or absence of the chipping of the edges of the front faces 2 for the purpose of evaluation of the strength of the suction faces 2, whether chipping occurred or not was determined as follows. Thirty five million electronic components 15 were sucked by the electronic component mounting device 14. Then the edges of the front face 2 of the vacuum suction nozzle 1 were observed with an optical microscope at a magnification of 50×. Symbol A was used to indicate that the front face 2 was not chipped until 35 million electronic components were sucked. Symbol B was used to indicate that chipping occurred when 25 to 30 million electronic components were sucked. Symbol C was used to indicate that chipping occurred when 20 to 25 million electronic components were sucked. Symbol D was used to indicate that chipping occurred when less than 20 million electronic components were sucked and that the vacuum suction nozzle was rejected. Table 7 shows the results.

TABLE 7

| Sample | Corresponding sample in Table 6 | Detachment of layer of conductivity-imparting material | Chipping of suction face |
|---|---|---|---|
| 113 | 68 | A | B |
| 114 | 69 | A | B |
| 115 | 70 | A | A |
| 116 | 71 | A | A |
| 117 | 72 | A | A |
| 118 | 73 | A | A |
| 119 | 74 | A | A |
| 120 | 75 | B | A |
| 121 | 79 | A | A |
| 122 | 80 | A | A |
| 123 | 81 | A | A |
| 124 | 82 | A | A |
| 125 | 83 | A | A |
| 126 | 84 | A | B |
| 127 | 85 | A | C |
| 128 | 86 | A | C |
| 129 | 87 | A | A |
| 130 | 88 | A | A |
| 131 | 89 | A | A |
| 132 | 90 | B | A |
| 133 | 91 | B | A |
| 134 | 93 | A | A |
| 135 | 94 | A | A |
| 136 | 95 | A | A |
| 137 | 96 | A | B |
| 138 | 97 | A | C |
| 139 | 98 | A | C |
| 140 | 101 | A | A |
| 141 | 102 | A | A |
| 142 | 103 | A | A |
| 143 | 104 | A | A |
| 144 | 105 | A | B |
| 145 | 106 | B | C |
| 146 | 112 | A | B |

The results shown in Table 8 demonstrated that with respect to the detachment of the layers 7 comprising the ceramic materials comprising the conductivity-imparting materials or the layers 7 comprising the conductivity-imparting materials, in samples 113 to 119, 121 to 131, 134 to 144, and 146 which were samples of the vacuum suction nozzles produced in this example according to an embodiment of the invention. No detachment occurred even when 20 million electronic components 15 were sucked. In samples 120, 132, 133, and 145, although some layers were detached to some extent, the vacuum suction nozzles were practically operable. This is because the layers 7 comprising the ceramic materials comprising the conductivity-imparting materials or the layers 7 comprising the conductivity-imparting materials each had a thickness exceeding 20 μm. Because of a difference in thermal expansion coefficient between the base ceramic materials and the layers 7 comprising the ceramic materials comprising the conductivity-imparting materials or the layers 7 comprising the conductivity-imparting materials, cracks were formed in the layers 7 when forming the conductive layer 7 by coating for sample 120, or on firing the formed articles to precipitate out the layers 7 for samples 132 and 133. Hence, the detachment of the layers 7 occurred from positions where the cracks were formed. Furthermore, in sample 145, the amount of the conductivity-imparting materials added exceeded about 40% by mass. Thus, the strength of the cylindrical portion 5 was reduced, which may have caused both the detachment of the conductive layer 7 and the chipping of the edges of the suction face 2.

Accordingly, each of the layers 7 comprising the ceramic materials comprising the conductivity-imparting materials or each of the layers 7 comprising the conductivity-imparting materials can have a thickness of about 20 μm or less as long as the cylindrical portion 5 had sufficient strength.

Next, with respect to the chipping of the edges of the suction faces 2, in samples 113 to 126, 129 to 137, 140 to 144, and 146 which were produced in this example of the present invention, no chipping occurred until 25 million electronic components 15 were sucked by the electronic component mounting device 14. In particular, in samples 115 to 125, 129 to 136, and 140 to 143, no chipping occurred until 35 million electronic components 15 were sucked. This may be because the amount of the conductivity-imparting materials added were 40% by mass or less, so that the strength of the front faces 2 of the vacuum suction nozzles 1 was maintained. In samples 127, 128, 138, 139, and 145, the amount of the conductivity-imparting materials added exceeded 40% by mass. Thus, the chipping of the edges of the front faces 2 occurred when 20 to 25 million electronic components were sucked.

Accordingly, it was found that in the case where the layers 7 composed of the ceramic materials comprising the conductivity-imparting materials were formed by precipitation from the base ceramic materials, the amount of the conductivity-imparting materials added to the base ceramic materials were 40% by mass or less.

While at least one exemplary embodiment has been presented in the foregoing detailed description, the present invention is not limited to the above-described embodiment or embodiments. Variations may be apparent to those skilled in the art. In carrying out the present invention, various modifications, combinations, sub-combinations and alterations may occur in regard to the elements of the above-described embodiment insofar as they are within the technical scope of the present invention or the equivalents thereof. The exemplary embodiment or exemplary embodiments are examples, and are not intended to limit the scope, applicability, or configuration of the invention in any way. Rather, the foregoing detailed description will provide those skilled in the art with a template for implementing the exemplary embodiment or exemplary embodiments. It should be understood that various changes can be made in the function and arrangement of elements without departing from the scope of the invention as set forth in the appended claims and the legal equivalents thereof. Furthermore, although embodiments of the present invention have been described with reference to the accompanying drawings, it is to be noted that changes and modifications may be apparent to those skilled in the art. Such changes and modifications are to be understood as being included within the scope of the present invention as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A vacuum suction nozzle, comprising:
a ceramic body;
a first surface of the ceramic body;
a second surface of the ceramic body at a side opposite to the first surface, wherein the ceramic body has an electric resistance of $10^3 \Omega$ to $10^{11} \Omega$ between the first surface and the second surface;
a through hole extending from the first surface to the second surface; and
an opening of the through hole on the first surface,
wherein the ceramic body comprises a conductivity material including a group consisting of iron oxide, cobalt oxide, chromium oxide, nickel oxide, zinc oxide, and titanium oxide.

2. The vacuum suction nozzle according to claim 1, wherein a substantially maximum dimension of the first surface is 0.7 mm in at least one of a first direction and a second direction perpendicular to the first direction.

3. The vacuum suction nozzle according to claim 1, wherein the electric resistance is $10^5 \Omega$ to $10^8 \Omega$.

4. The vacuum suction nozzle according to claim 1, wherein the ceramic body further comprises a conductive layer on a side surface of the ceramic body.

5. The vacuum suction nozzle according to claim 1, wherein the vacuum suction nozzle has a black color.

6. The vacuum suction nozzle according to claim 1, wherein the ceramic body comprises zirconium oxide.

7. The vacuum suction nozzle according to claim 6, wherein the zirconium oxide comprises stabilized zirconia.

8. A vacuum suction nozzle, comprising:
a ceramic body;
a first surface of the ceramic body;
a second surface of the ceramic body at a side opposite to the first surface, wherein the ceramic body has an electric resistance of $10^3 \Omega$ to $10^{11} \Omega$ between the first surface and the second surface;
a through hole extending from the first surface to the second surface; and
an opening of the through hole on the first surface,
wherein the ceramic body comprises a conductivity-imparting material including at least one of titanium carbide and titanium nitride.

9. The vacuum suction nozzle according to claim 4, wherein the conductive layer comprises a ceramic material and a conductive material.

10. The vacuum suction nozzle according to claim 4, wherein the conductive layer comprises a precipitation product from the ceramic body.

11. The vacuum suction nozzle according to claim 4, wherein the conductive layer comprises a deposited film.

12. The vacuum suction nozzle according to claim 8, wherein the ceramic body further comprises a conductive layer on a side surface of the ceramic body.

13. The vacuum suction nozzle according to claim 12, wherein the conductive layer comprises a ceramic material and a conductive material.

14. The vacuum suction nozzle according to claim 8, wherein the vacuum suction nozzle has a black color.

15. A vacuum suction nozzle, comprising:
a ceramic body;
a first surface of the ceramic body;
a second surface of the ceramic body at a side opposite to the first surface, wherein the ceramic body has an electric resistance of $10^3 \Omega$ to $10^{11} \Omega$ between the first surface and the second surface;
a through hole extending from the first surface to the second surface; and
an opening of the through hole on the first surface,
wherein the ceramic body further comprises:
65% to 80% by mass of the stabilized zirconia; and
20% to 35% by mass of at least one of iron oxide, chromium oxide and titanium oxide.

16. The vacuum suction nozzle according to claim 15, wherein the ceramic body further comprises a conductive layer on a side surface of the ceramic body.

17. The vacuum suction nozzle according to claim 16, wherein the conductive layer comprises a ceramic material and a conductive material.

18. The vacuum suction nozzle according to claim 15, wherein the vacuum suction nozzle has a black color.

* * * * *